(12) United States Patent
Lu et al.

(10) Patent No.: US 9,378,832 B1
(45) Date of Patent: Jun. 28, 2016

(54) METHOD TO RECOVER CYCLING DAMAGE AND IMPROVE LONG TERM DATA RETENTION

(71) Applicant: SanDisk Technologies Inc., Plano, TX (US)

(72) Inventors: Ching-Huang Lu, Fremont, CA (US); Zhengyi Zhang, San Jose, CA (US); Wei Zhao, Fremont, CA (US); Yingda Dong, San Jose, CA (US); Jian Chen, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 72 days.

(21) Appl. No.: 14/565,729

(22) Filed: Dec. 10, 2014

(51) Int. Cl.
*G11C 16/16* (2006.01)
*G11C 16/34* (2006.01)
*G11C 16/04* (2006.01)
*G11C 16/32* (2006.01)

(52) U.S. Cl.
CPC ............ *G11C 16/16* (2013.01); *G11C 16/0466* (2013.01); *G11C 16/32* (2013.01); *G11C 16/3459* (2013.01); *G11C 16/3495* (2013.01)

(58) Field of Classification Search
None
See application file for complete search history.

(56) References Cited

U.S. PATENT DOCUMENTS

| | | | |
|---|---|---|---|
| 7,414,894 B2 | 8/2008 | Lutze et al. | |
| 8,169,833 B2 | 5/2012 | Halabi et al. | |
| 8,644,071 B2 | 2/2014 | Yang et al. | |
| 8,732,391 B2 | 5/2014 | Shepard et al. | |
| 2009/0327581 A1 | 12/2009 | Coulson | |
| 2010/0165689 A1 | 7/2010 | Rotbard et al. | |
| 2012/0140569 A1 | 6/2012 | Goda et al. | |
| 2013/0194874 A1 | 8/2013 | Mu et al. | |
| 2013/0194875 A1 | 8/2013 | Mu et al. | |
| 2014/0059405 A1 | 2/2014 | Syu et al. | |
| 2014/0286097 A1 | 9/2014 | Lue et al. | |
| 2014/0347936 A1 | 11/2014 | Ghaly | |
| 2014/0355347 A1 | 12/2014 | Shur et al. | |

OTHER PUBLICATIONS

International Search Report & The Written Opinion of the International Searching Authority dated Jan. 12, 2016, International Application No. PCT/US2015/054454.
Cai, Yu, et al., "Flash Correct-and-Refresh: Retention-Aware Error Management for Increased Flash Memory Lifetime," Dept. of Electrical and Computer Engineering, Carnegie Mellon University, Pittsburgh, PA, Oct. 2012, 8 pages.

(Continued)

*Primary Examiner* — Kretelia Graham
(74) *Attorney, Agent, or Firm* — Vierra Magen Marcus LLP

(57) ABSTRACT

Techniques for reversing damage caused by program-erase cycles in charge-trapping memory to improve long term data retention. A recovery process improves the data retention of a block of memory cells by programming the memory cells to a relatively high threshold voltage and enforcing a time period of several minutes or hours in which the memory cells are inactive and remain at the relatively high Vth levels. Damage such as traps in the memory cells is essentially healed or annealed out during this inactive period. All of the memory cells can be healed at the same time and by relatively equal amounts. At the conclusion of the recovery process, the block is returned to a pool of available blocks. In one approach, an amount of recovery is measured and the period of inactivity is continued for an amount of time which is based on the amount of recovery.

24 Claims, 20 Drawing Sheets

(56) References Cited

OTHER PUBLICATIONS

Fayrushin, Albert, et al., "The New Program/Erase Cycling Degradation Mechanism of NAND Flash Memory Devices," IEEE Electron Devices Meeting, Dec. 2009, 4 pages.

Mohan, Vidyabhushan, et al., "How I Learned to Stop Worrying and Love Flash Endurance," HotStorage'10 Proceedings of the 2nd USENIX conference on Hot topics in storage and file systems, Jun. 22, 2010, 5 pages.

Lee, Sungjin, et al., "Lifetime Management of Flash-Based SSDs Using Recovery-Aware Dynamic Throttling," Proceedings of the 10th USENIX conference on File and Storage Technologies, Feb. 14-17, 2012, 14 pages.

Lun, Zhiyuan, et al., "Simulation on Endurance Characteristic of Charge Trapping Memory," 2013 International Conference on Simulation of Semiconductor Processes and Devices (SISPAD), Sep. 2013, 4 pages.

Miccoli, Carmine, et al., Threshold-Voltage Instability Due to Damage Recovery in Nanoscale NAND Flash Memories, IEEE Transactions on Electron Devices, vol. 58. No. 8, Aug. 2011, 9 pages.

Pan, Yangyang, et al., "Exploiting Memory Device Wear-Out Dynamics to Improve NAND Flash Memory System Performance," Proceeding FAST'11 Proceedings of the 9th USENIX conference on File and stroage technologies, Feb. 2011, 14 pages.

Mohan, Vidyabhushan, et al., "reFRESH SSDs: Enabling High Endurance, Low Cost Flash in Datacenters," Technical Report CS-2012-05, May 2012, 20 pages.

Wu, Qi, et al., "Exploiting Heat-Accelerated Flash Memory Wear-Out Recovery to Enable Self-Healing SSDs," HotStorage'11 Proceedings of the 3rd USENIX conference on Hot topics in storage and file systems, Jun. 2011, 5 pages.

Fig. 1C

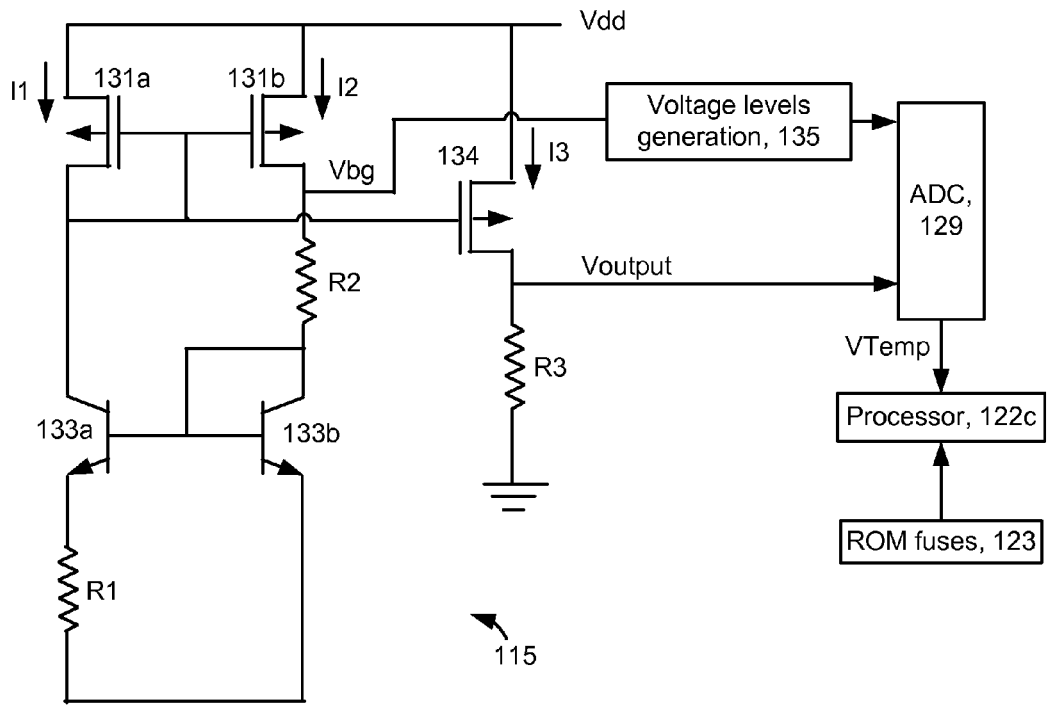

Fig. 1D

Code in storage device (150)

boot code (151)

control code / set of instructions (160)

instructions to determine that memory cells in a block have been subject to a specified amount of usage (161)

instructions to perform a data recovery process for the memory cells by erasing the block, programming the memory cells to at least to the highest data state, and enforcing a time period in which the memory cells are inactive (162)

instructions to release the block to a pool of blocks which are available to be programmed upon conclusion of the time period (163)

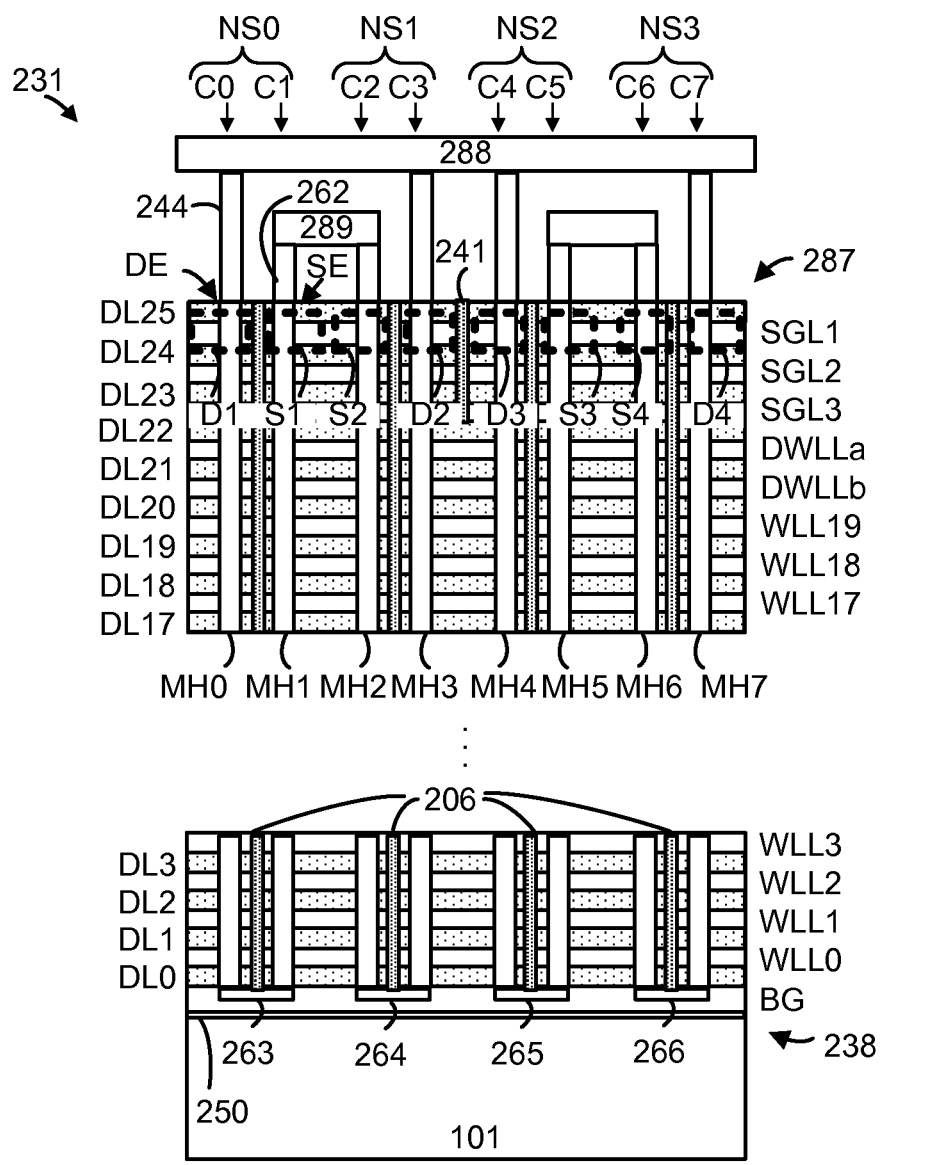

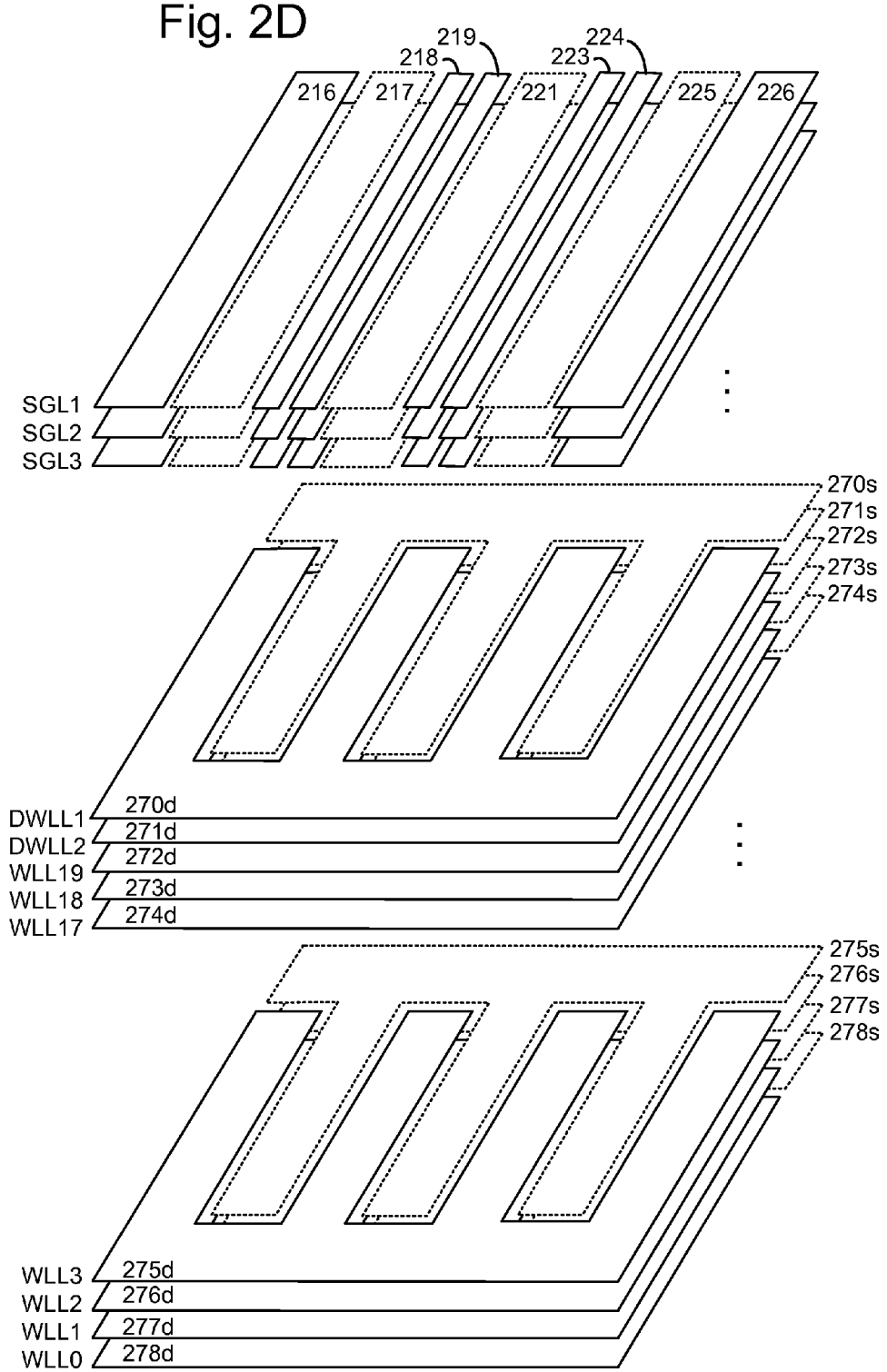

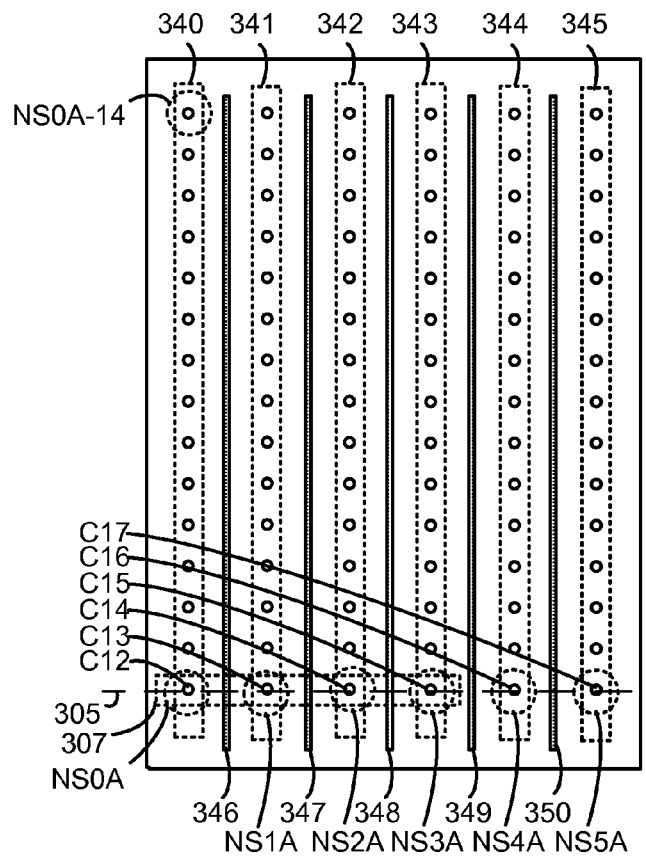
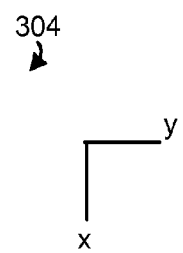
Fig. 3A
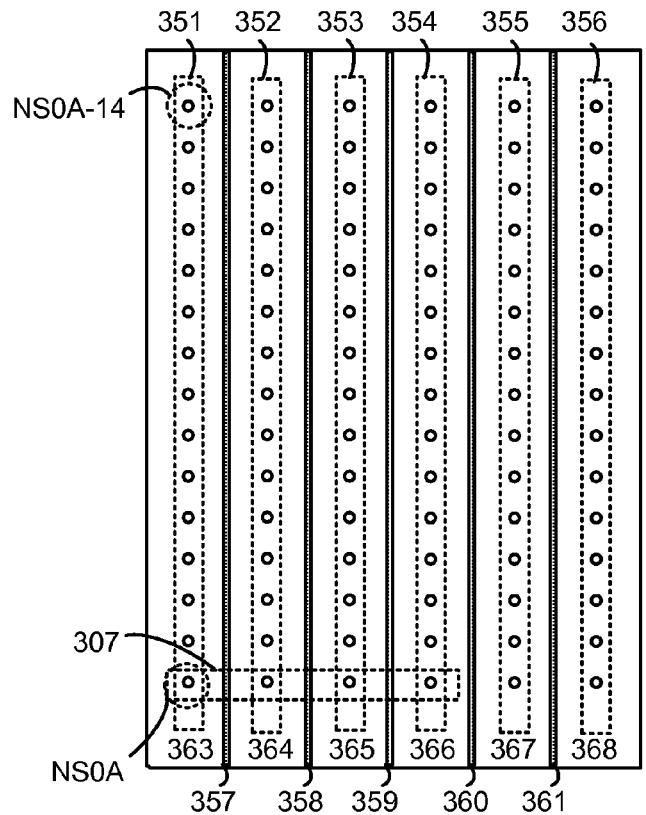
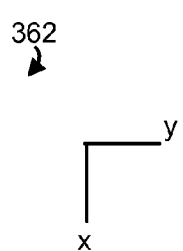
Fig. 3B

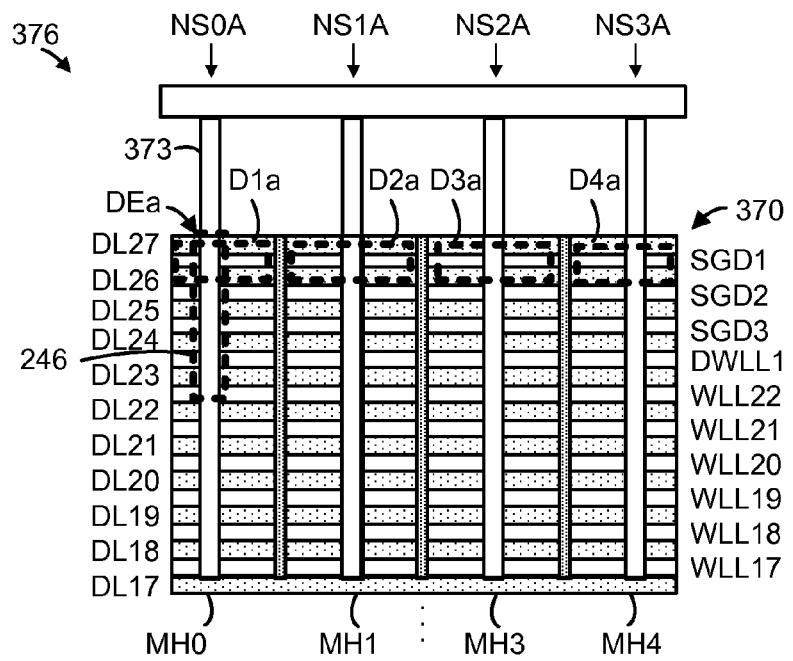
Fig. 3C1
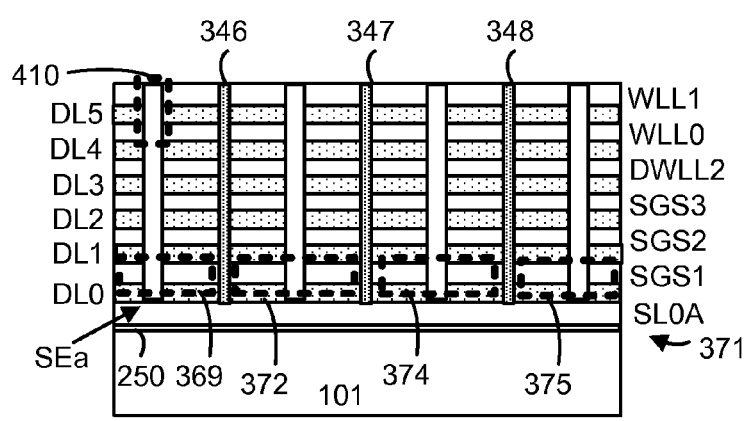
Fig. 3C2

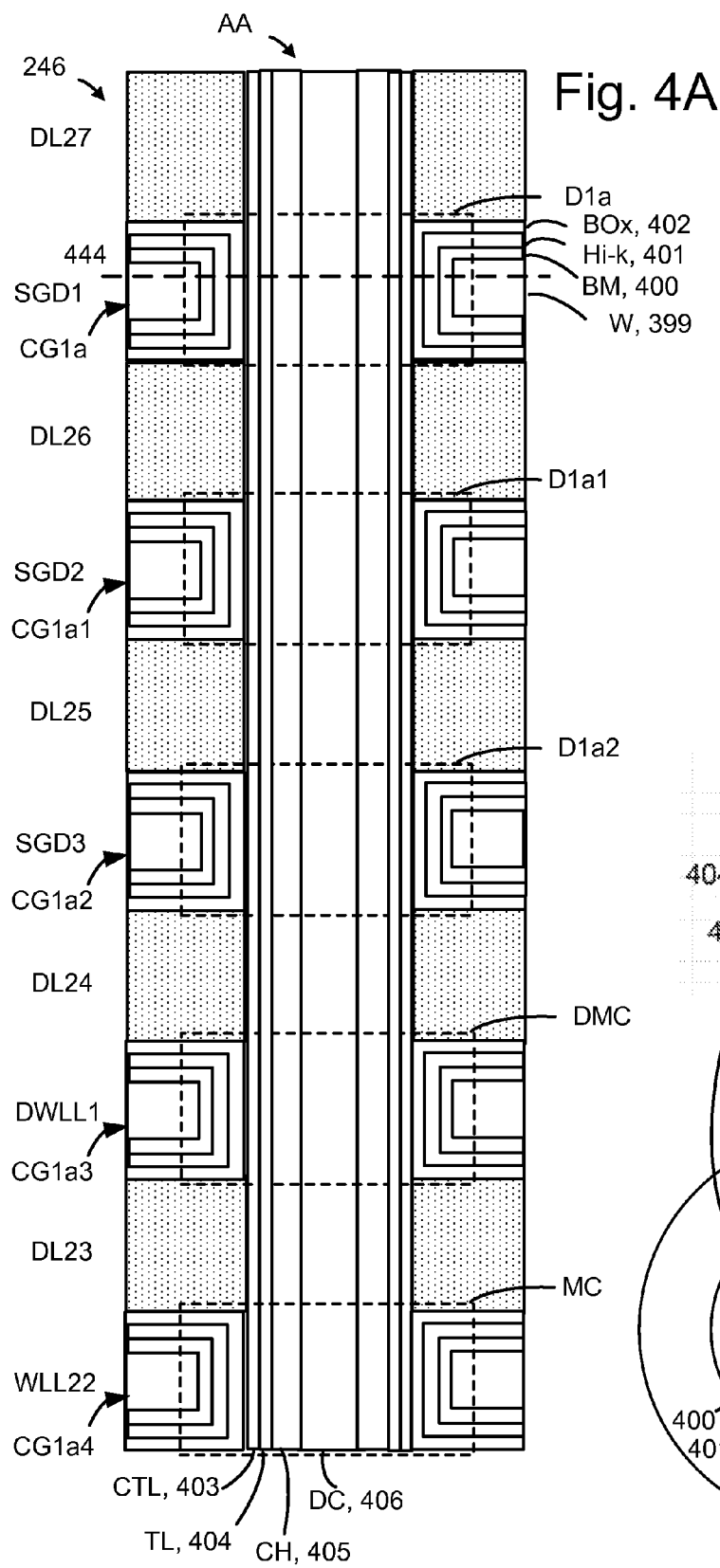
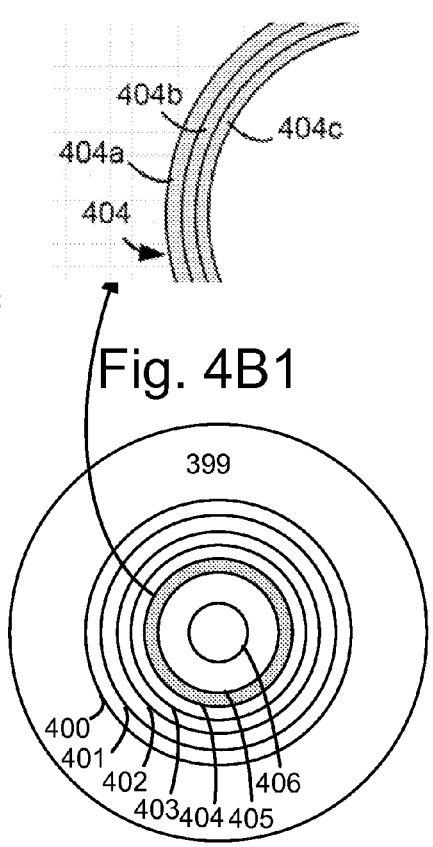
Fig. 4A
Fig. 4B1
Fig. 4B2

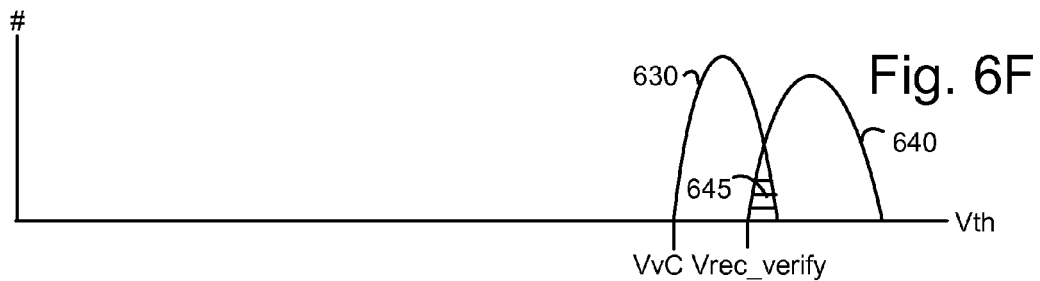
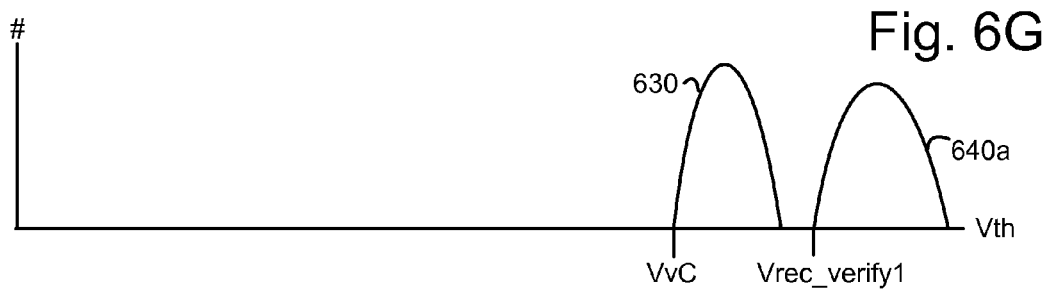
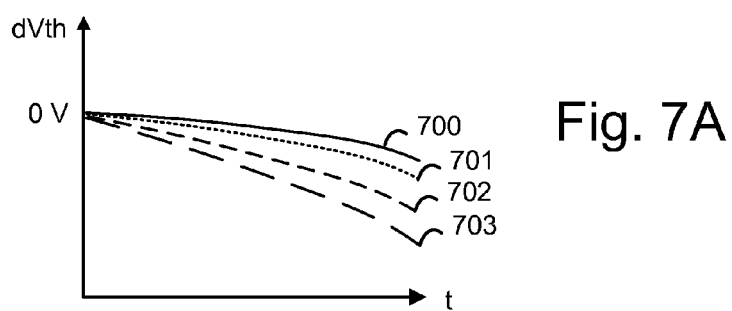
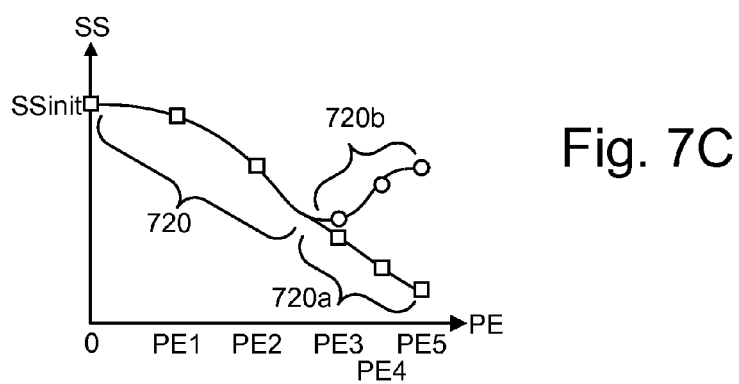

US 9,378,832 B1

METHOD TO RECOVER CYCLING DAMAGE AND IMPROVE LONG TERM DATA RETENTION

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1C depicts an example of the temperature circuit 115 of FIG. 1B.

FIG. 1D depicts code which may be executed by a processor.

FIG. 2C depicts an embodiment of a stack 231 showing a cross-sectional view of the portion 209 of FIG. 2A, along line 220, where three select gate layers, SGL1, SGL2 and SGL3 are provided.

FIG. 2D depicts an alternative view of the select gate layers and word line layers of the stack 231 of FIG. 2C.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided.

FIG. 3C2 depicts a variation in the width of a memory hole along its height.

FIG. 4A depicts a view of the region 246 of FIG. 3C1, showing SGD transistors D1a (consistent with FIG. 3C1), D1a1 and D1a2 above a dummy memory cell (DMC) and a data-storing memory cell (MC).

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 6F depicts the Vth distribution 630 of the highest target data state used in normal programming of user data (from FIG. 6A) with the Vth distribution 640 of the recovery state (from FIG. 6B).

FIG. 6G depicts the Vth distribution 630 of the highest target data state used in normal programming of user data (from FIG. 6A) with a Vth distribution 640a of the recovery state.

FIG. 7A is a graph depicting a decrease in Vth over time for a block of memory cells.

FIG. 7B is a plot of drain current (Id) versus control gate voltage (Vcg) as a function of PE cycles.

FIG. 7C is a plot of a subthreshold slope (SS) as a function of PE cycles, showing plots 720 and 720a which apply when no recovery process is used and a plot 720b which applies when a recovery process is used.

DETAILED DESCRIPTION

Figure 1A:
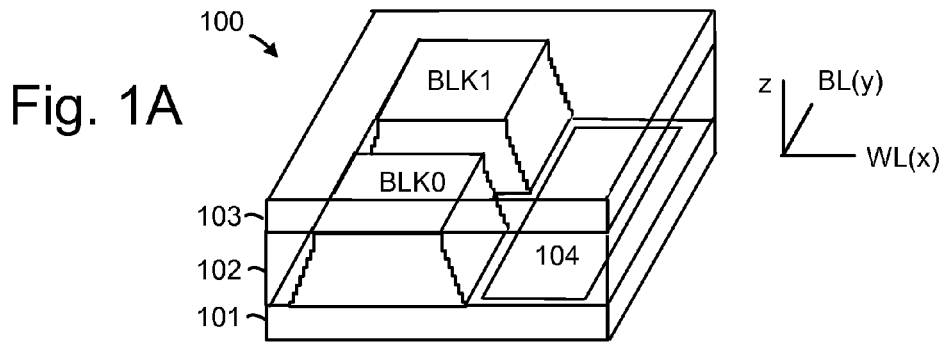
FIG. 1A is a perspective view of a 3D stacked non-volatile memory device.

Techniques are provided for reversing damage caused by program-erase (PE) cycles in charge-trapping memory to improve long term data retention.

A charge-trapping memory device may use a charge-trapping material such as silicon nitride layer which is separated from a channel layer by a tunneling layer. One example of a charge-trapping memory device is a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping layer extends horizontally along a NAND string.

During programming and erase, electrons pass through the tunneling layer. The tunneling layer can be an oxide such as SiO2 or an engineered tunneling barrier which is comprises of multiple layers such as oxide-nitride-oxide. As PE cycles are accumulated, traps are generated at the interface between the tunneling layer and the polysilicon channel layer which degrade performance. One theory is that traps are caused when hydrogen is released form passivated SiH bonds. Additionally, PE cycles cause damage and trap generation in the tunneling layers. As a result, after PE cycling, the ability of a memory cell to retain electrons in the charge-trapping layer is reduced and data retention becomes worse. In particular, PE cycling reduces long-term data retention, causing wider Vth distributions which are downshifted below the verify voltages, and a narrower Vth window for the memory device. As a result of the charge loss, the Vth of a memory cell can decrease to the point where the target data state cannot be accurately read back. This is in conflict with the need to provide narrow Vth distributions to allow multiple data states to be reliably stored.

A recovery process provided herein improves the data retention of a block of memory cells by periodically performing a recovery process over the lifetime of the block. The recovery process involves programming the memory cells to a relatively high Vth and enforcing a time period of several minutes or hours in which the memory cells are inactive and remain at the relatively high Vth levels. Damage such as traps in the memory cells is essentially healed or annealed out during this inactive period. All of the memory cells can be healed at the same time and by relatively equal amounts in this approach. At the conclusion of the recovery process, the block is returned to a pool of available blocks for further program and erase operations. In one approach, the relatively high Vth is at least as high as a highest data state which is used to store user data at other times.

In one aspect, the recovery process is initiated in response to the block of memory cells reaching a specified number of program-erase cycles. In another aspect, the recovery process is initiated adaptively based on a change in a number of program or erase loops which is a function of the number of program-erase cycles. The recovery process can last for a time period which is predetermined at a start of the time period. The time period can be a function of the number of program-erase cycles, a number of program-erase cycles since a last recovery process and/or a function of temperature. Optionally, the memory device includes a heater which is activated for the recovery process. In another approach, the recovery process lasts for a time period which is not predetermined at a start of the time period. For example, after a specified time which is a checkpoint, an amount of recovery for the memory cells can be measured and a decision can be made to end or continue the recovery process. The amount of recovery can be based on a count of memory cells having a Vth below the verify voltage or below another specified level. If the recovery process is continued, it can continue for an amount of time which is based on the measured amount of recovery. In one approach, a separate new recovery process is performed based on the measured amount of recovery.

In one approach, the programming of the memory cells in the recovery process uses a verify voltage of a highest target data state, or a verify voltage which is higher than the highest target data state. Or, the recovery process can perform no verify test since a wider Vth distribution can be tolerated. The recovery process can also use a same program pulse step size as is used in normal programming. Or, the recovery process can use a larger program pulse step size compared to normal programming since a wider Vth distribution can be tolerated.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
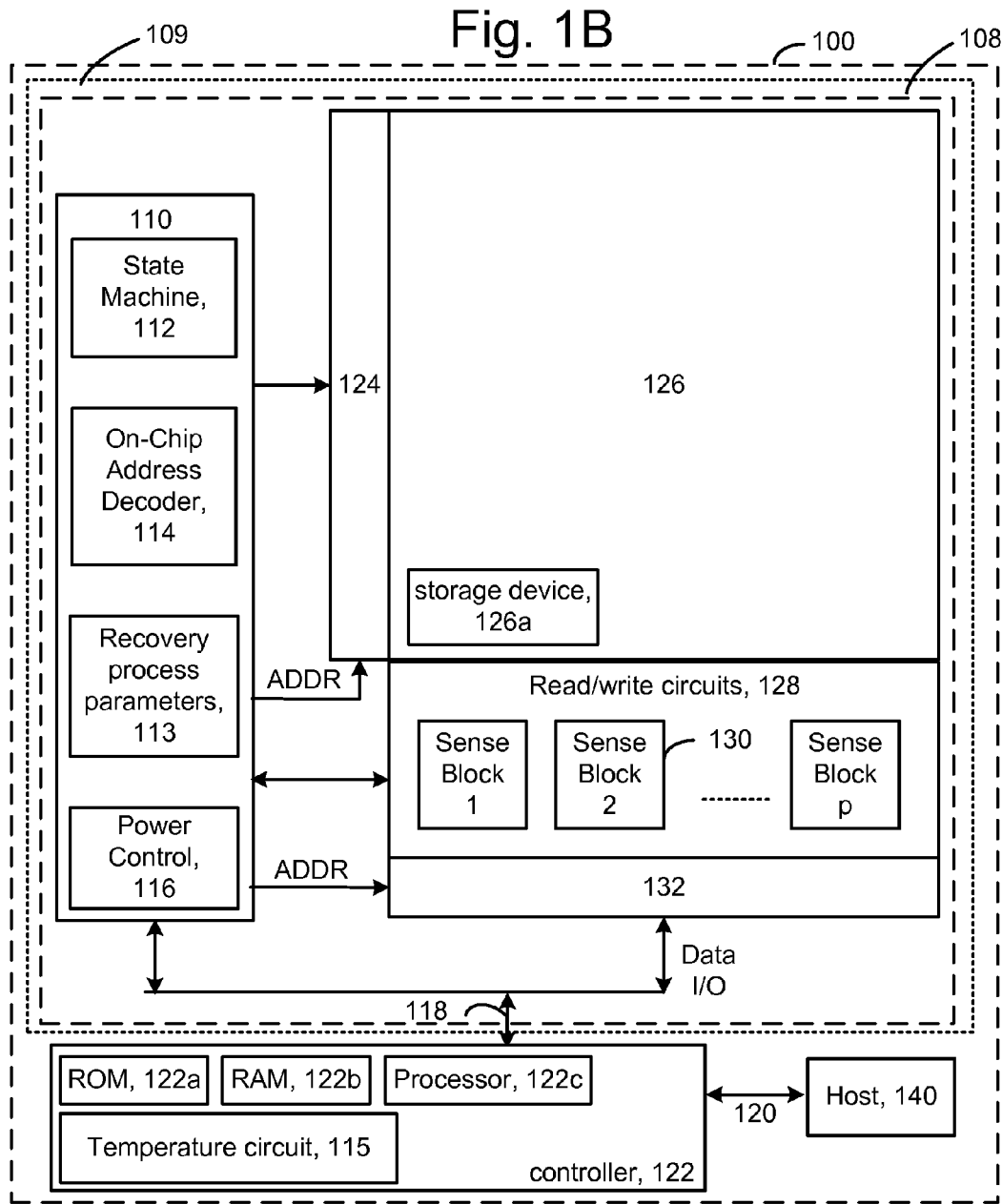
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via lines 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for a recovery process.

The controller 122 may also include a temperature circuit 115 which is used by the processor 122c to provide an ambient temperature of the memory device. The temperature can be used, e.g., to determine a time of the recovery process or a level of the verify voltage used in the programming in the recovery process, as described further below. See also FIGS. 9B and 9D.

FIG. 1C depicts an example of the temperature-sensing circuit 115 of FIG. 1B. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Referring again to FIG. 1B, the on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1D depicts code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The control code further includes instructions to determine that memory cells in a block have been subject to a specified amount of usage (161), instructions to perform a data recovery process for the memory cells by erasing the block, programming the memory cells to at least the highest data state, and enforcing a time period in which the memory cells are inactive (162), and instructions to release the block to a pool of blocks which are available to be programmed upon conclusion of the time period (163). Generally, the control code can include instructions to perform the functions described herein including the steps of the processes of FIGS. 8A, 8C, 8D and 8E.

Other types of non-volatile memory in addition to NAND flash memory can also be used.

In FIG. 1B, the memory device may include a heater 109 which applies heat to the memory device at specified times such as during a recovery process to increase the effectiveness and speed of the recovery process. For example, the heater 109 may be provided as a separate die which is above or below one or more memory die such as the memory die 108. See FIG. 1E for further details. For example, the heater may contain arrays of resistors, such as polysilicon resistors, which generate heat and thus increase the temperature within a chip package which includes the memory die 108. A heating capability of 45 C/113 F has been demonstrated with this type of heater. Optionally, a backup chip which is not heated is provided to store data from the memory die 108 when it is being heated in a recovery process. User data could be affected when the chip is heated.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 1E:
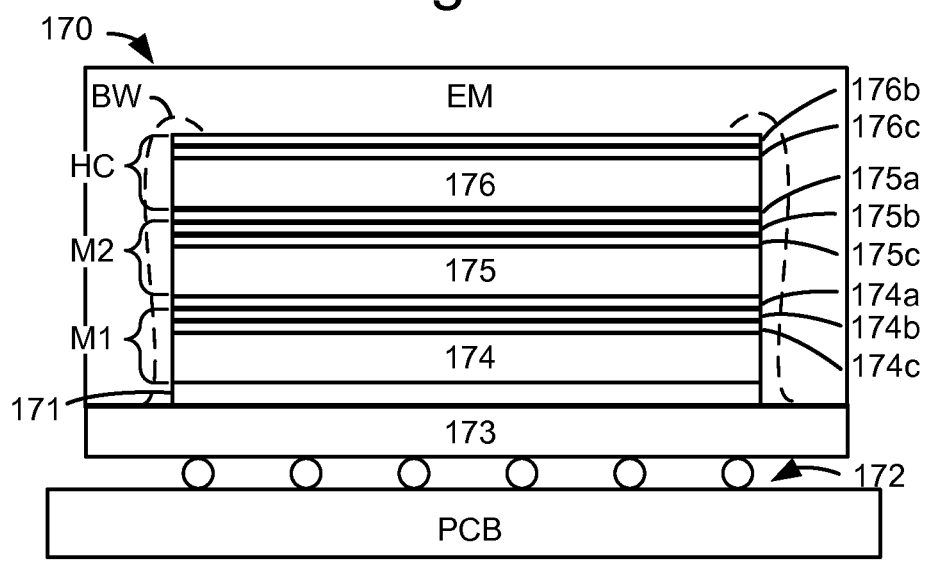
FIG. 1E depicts a memory apparatus which includes a heater.

FIG. 1E depicts a memory apparatus which includes a heater. As mentioned in connection with FIG. 1B, it is possible to provide a heater which can be used to heat one or more memory chips during a recovery process. An example memory apparatus 170 has a stacked configuration. The memory apparatus is in a package which includes a heater chip HC above two memory chips M1 and M2 with an encapsulation material EM. The memory chip M1 is on a thermal interface 171 which in turn is on a material interposer 173. The package rests on solder balls 172 on a printed circuit board (PCB). Each chip comprises a metal layer above an active silicon layer which in turn is above a silicon substrate. For example, the memory chip M1 comprises a metal layer 174b above an active silicon layer 174c which in turn is above a silicon substrate 174, and the memory chip M2 comprises a metal layer 175b above an active silicon layer 175c which in turn is above a silicon substrate 175. The heater chip HC comprises a metal layer 176b above an active silicon layer 176c which in turn is above a silicon substrate 176. An adhesive layer is also provided between adjacent chips. For example, an adhesive layer 174a is provided between M1 and M2 and an adhesive layer 175a is provided between M2 and HC. Bonding wires (BW) connect the top metal layer 176c to the material interposer 173. Heat which is generated from the HC will dissipate primarily downward in a path through the memory chips and to the PCB, since this path has a lower convection resistance compared to an upward path though the encapsulation and to the air.

The controller 122 can control each of the chips, including activating the HC at specified times in connection with a recovery process. In one approach, the HC is activated until the temperature reaches a specified level according to the temperature circuit 115.

Figures 2A, 2B:
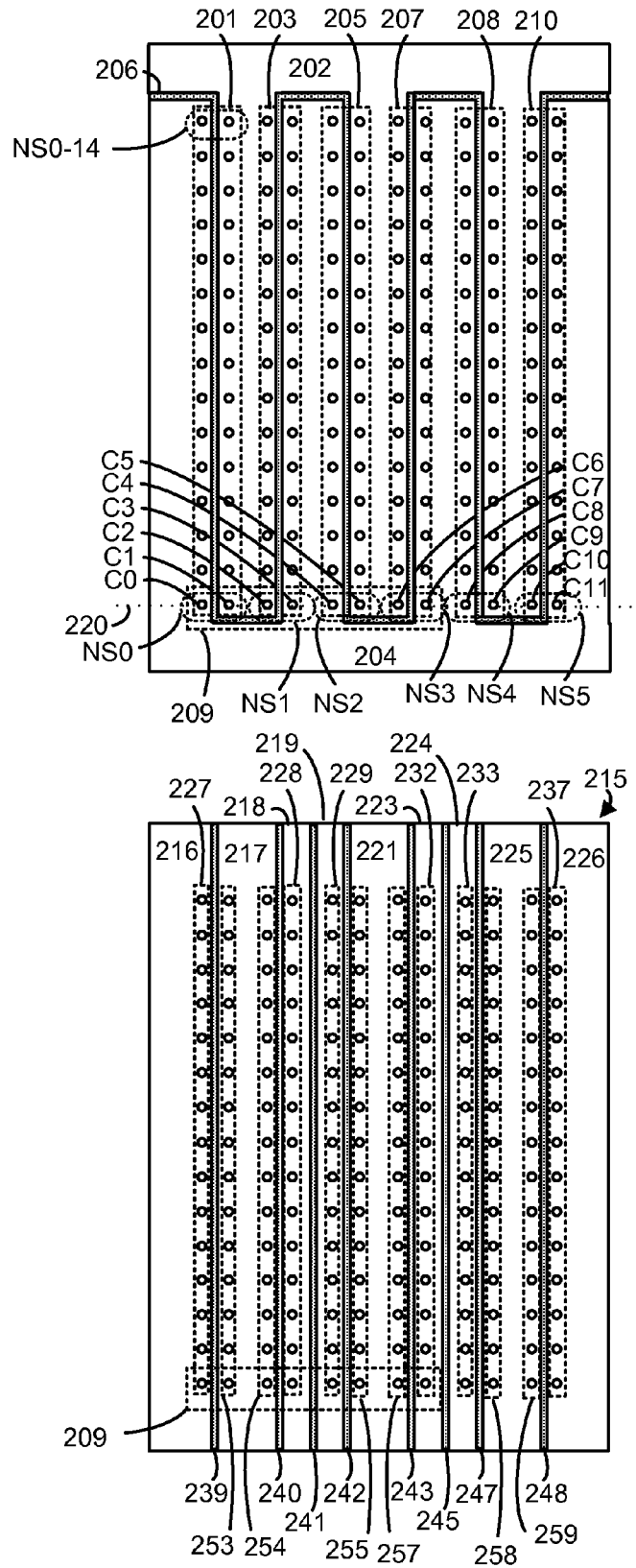
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of $SiO_2$, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270$d$, 271$d$, 272$d$, 273$d$ and 274$d$, respectively, and source-side word lines 270$s$, 271$s$, 272$s$, 273$s$ and 274$s$, respectively.

WLL3, WLL2, WLL1 and WLL0 include drain-side word lines 275$d$, 276$d$, 277$d$ and 278$d$, respectively, and source-side word lines 275$s$, 276$s$, 277$s$ and 278$s$, respectively. Each word line can be controlled independently, in one approach.

In an example programming operation, the source-side word line 272$s$ is a first programmed word line and a drain-side word line 272$d$ is a final programmed word line in a block.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided. Columns of memory cells corresponding to NAND strings NS0A-

NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

Figure 4C:
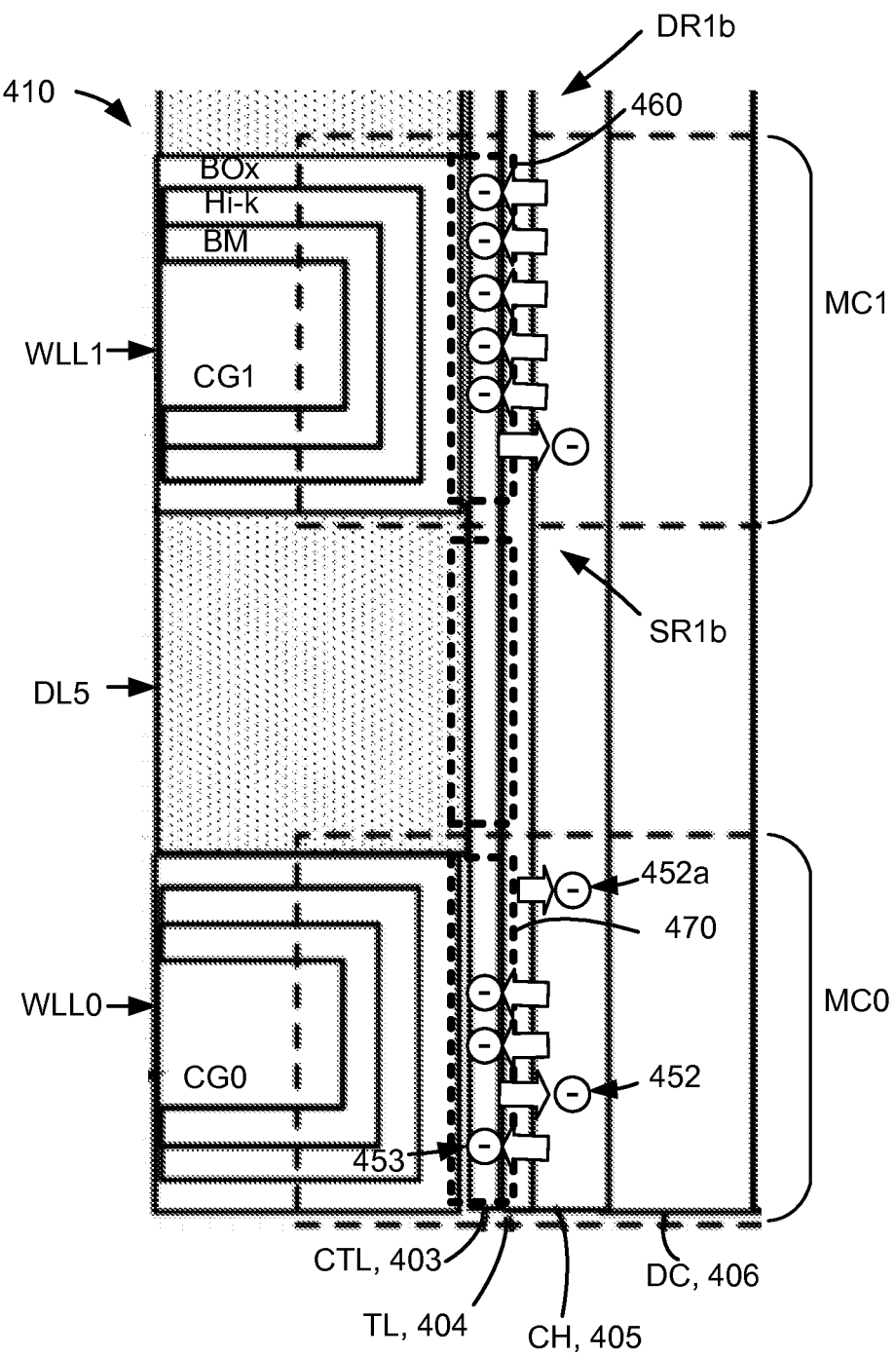
FIG. 4C depicts an expanded view of a region 410 of the NAND string of FIG. 3C2.

A region 246 of the stack is shown in greater detail in FIG. 4A. A region 410 of the stack is shown in greater detail in FIG. 4C. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (MH0-MH7) in the memory device, and a width of the vertically-extending memory holes varies along a height of the memory device.

Figure 3D:
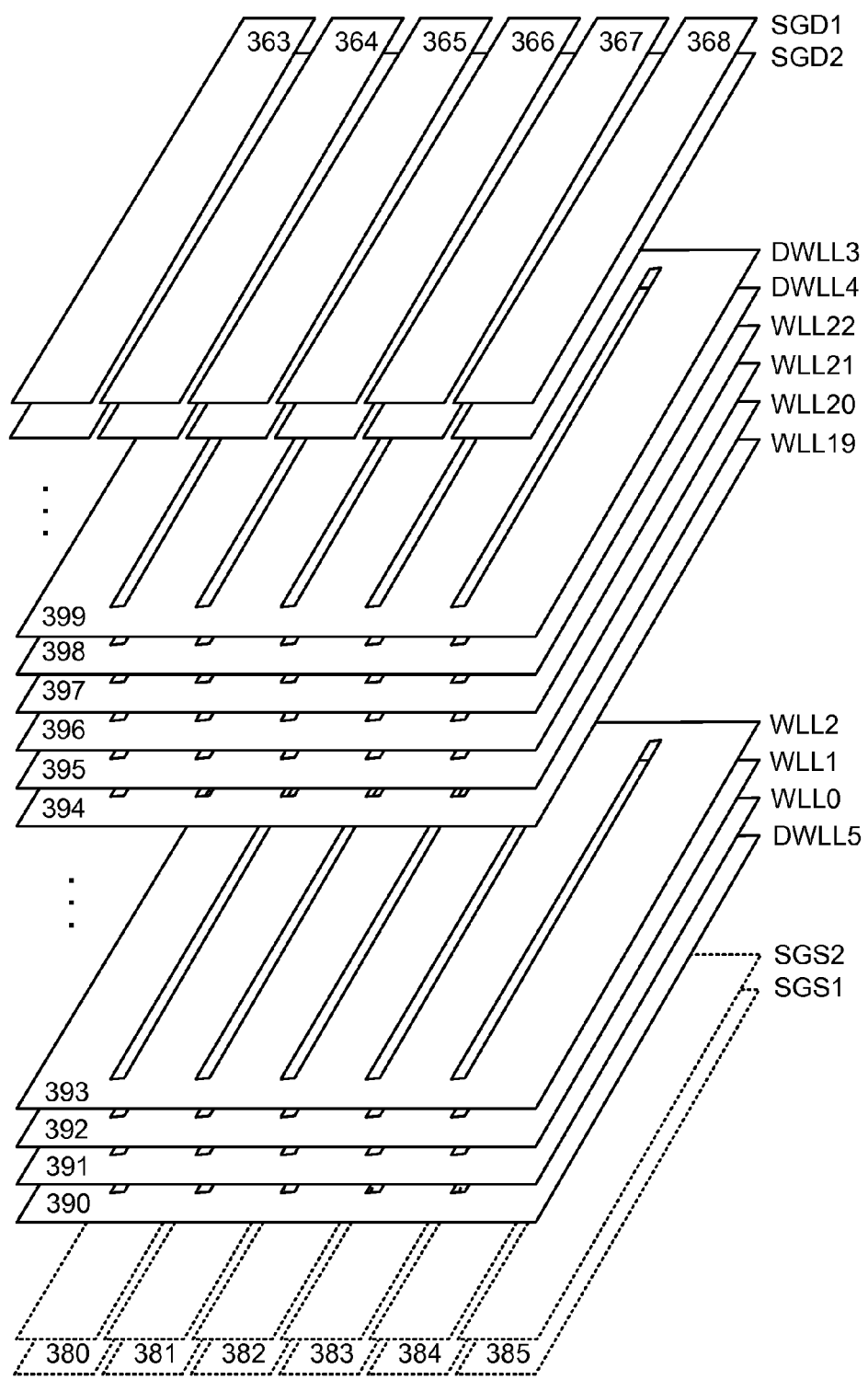
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL3, DWLL4, WLL22, WLL21, WLL20 and WLL19 represent word lines 399, 398, 397, 396, 395 and 394, respectively. WLL2, WLL1, WLL0 and DWLL5 represent word lines 393, 392, 391 and 390, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a, D1a1 and D1a2 above a dummy memory cell (DMC) and a data-storing memory cell (MC). A number of layers can be deposited along the sidewalls of the column and within each word line layer. These layers can include oxide-nitride-oxide (O-N-O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a, D1a1 and D1a2, the dummy memory cell DMC and the memory cell MC, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively lower amount of channel boosting in a region of the channel next to these select gate transistors. A region of the channel next to an edge cell will therefore also have a relatively lower amount of channel boosting. In contrast, the memory cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

FIG. 4C depicts an expanded view of a region 410 of the NAND string of FIG. 3C2. When a program voltage is applied to the control gate of a memory cell via a respective word line, an electric field is generated. In MC0, the electric field causes electrons to tunnel into a region 470 of the charge-trapping layer 403, from the channel 405. Similarly, for MC1, the electric field causes electrons to tunnel into a region 460 of the charge-trapping layer 403, from the channel 405. The movement of the electrons into the charge-trapping layer is represented by the arrows which point to the left. The electrons are represented by circles with a dash inside the circle.

When a memory cell on a selected word line is subsequently read back, control gate read voltages such as VreadA, VreadB and VreadC are applied to the memory cell while sensing circuitry determines whether the memory cell is in a conductive state. At the same time, a read pass voltage, Vread (e.g., 8-9 V), is applied to the remaining word lines.

However, as mentioned at the outset, the accuracy of the read back operation can be impaired by charge loss in the memory cells. One type of charge loss involves de-trapping from the charge-trapping layer. For example, an electron 452 is an example of a charge which has de-trapped from the charge-trapping region 470, lowering the Vth of MC0. An electron 453 is an example of a charge which remains in the charge-trapping region 470. Another type of charge loss involves de-trapping from the tunneling layer. For example, an electron 452a is an example of a charge which has de-trapped from the tunneling layer 404.

MC1 has a drain DR1b, a source SR1b and a control gate CG1.

Figure 5A:
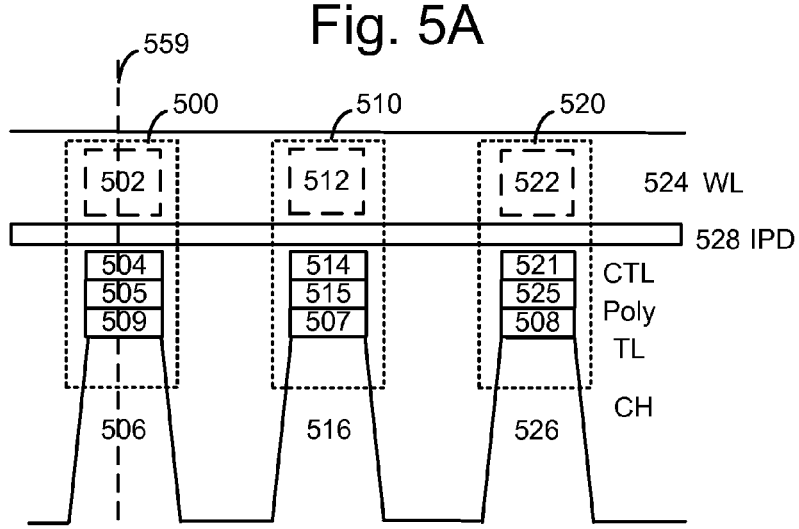
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel ling layer (TL) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
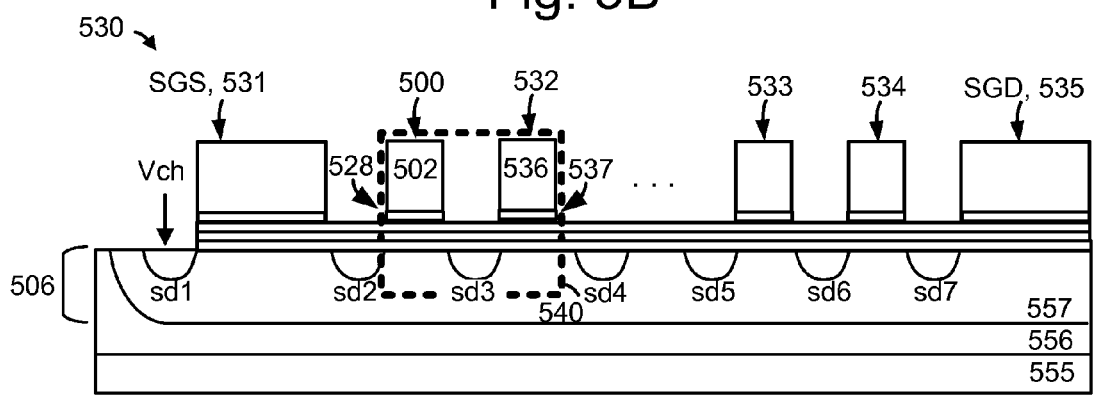
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, ..., 533 and 534, and an SGD transistor 535. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well 557. A channel voltage, Vch, may be applied directly to the channel region of the substrate. The memory cell 500 includes the control gate 502 and an IPD portion 528 above the charge-trapping layer 504, the polysilicon layer 505, the tunneling layer 509 and the channel region 506. The memory cell 532 includes a control gate 536 and an IPD portion 537 above the charge-trapping layer 504, the polysilicon layer 505, the tunneling layer 509 and the channel region 506.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the storage elements but with a longer channel length to ensure that current is cutoff in an inhibited NAND string.

In this example, the layers 504, 505 and 509 extend continuously in the NAND string. In another approach, portions of the layers 504, 505 and 509 which are between the control gates 502, 512 and 522 can be removed, exposing a top surface of the channel 506.

Figure 5C:
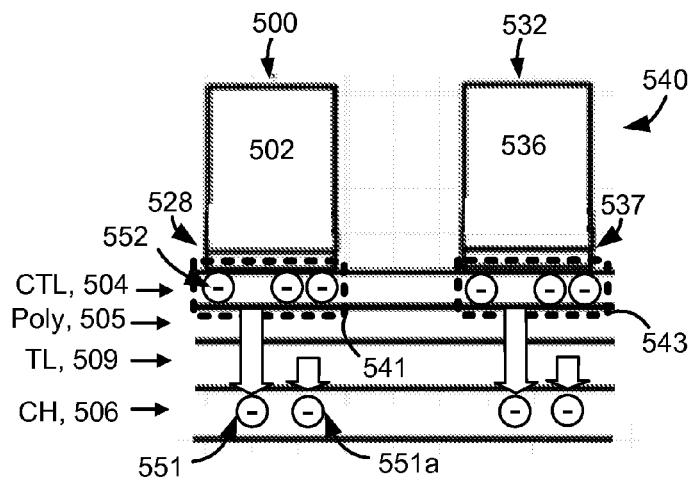
FIG. 5C depicts an expanded view of a portion 540 of the NAND string of FIG. 5B.

FIG. 5C depicts an expanded view of a portion 540 of the NAND string of FIG. 5B. The charge-trapping layer 504 includes regions 541 and 543 which are directly under and adjacent to the memory cells 500 and 532, respectively. Charge loss can occur in a 2D memory device in a similar way as in the 3D memory device. An electron 551 is an example of a charge which has de-trapped from the charge-trapping region 541, lowering the Vth of the memory cell 500. An electron 552 is an example of a charge which remains in the charge-trapping region 541. An electron 551a is an example of a charge which has de-trapped from the tunneling layer 509.

In FIG. 6A to 6G, the horizontal axis depicts Vth on a linear scale and the vertical axis depicts a number of memory cells on a logarithmic scale.

Figure 6A:
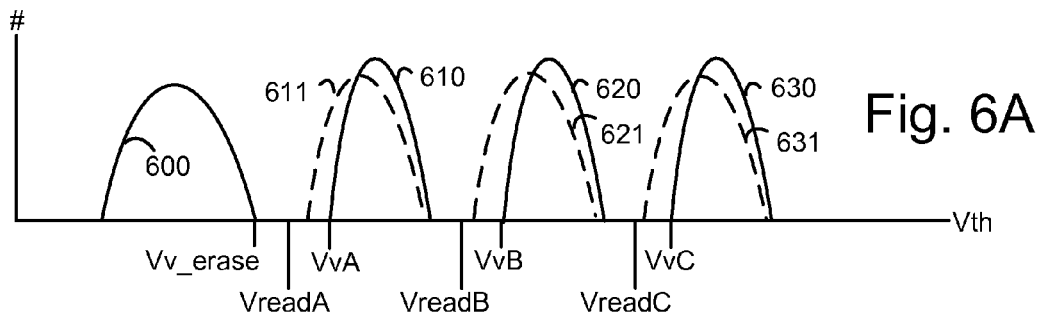
FIG. 6A depicts threshold voltage (Vth) distributions of a set of memory cells, showing a decrease in Vth due to charge loss.

FIG. 6A depicts Vth distributions of a set of memory cells, showing a decrease in Vth due to charge loss. A set of memory cells may be initially erased to an erased state Vth distribution 600 using a verify voltage of Vv_erase. Subsequently, when a command to program data is issued, the set of memory cells is programmed from the erased state to the target data states of A, B and C using verify voltages of VvA, VvB and VvC, respectively, in a four state memory device. In other cases, eight, sixteen or more data states are used. The erased state and the initial A, B and C states, immediately after programming, are represented by Vth distributions 600, 610, 620 and 630, respectively. After programming, charge loss occurs over time in the programmed memory cells so that the Vth distributions 610, 620 and 630 shift down and widen to become the Vth distributions 611, 621 and 631, respectively.

Figure 6B:
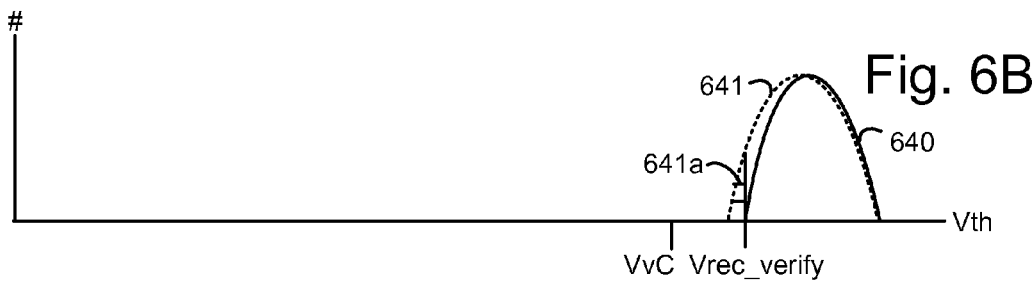
FIG. 6B depicts a Vth distribution of a set of memory cells after a first amount of time has passed in the recovery progress, showing a count of a number of memory cells having a Vth<Vrec_verify where Vrec_verify>VvC.

FIG. 6B depicts a Vth distribution of a set of memory cells after a first amount of time has passed in the recovery progress, showing a count of a number of memory cells having a Vth<Vrec_verify (recovery verify) where Vrec_verify>VvC. In a recovery process for a block, the memory cells of the block are erased from the Vth distributions 611, 621 and 631 of FIG. 6A to the erased state Vth distribution 600. Subsequently, the memory cells are programmed from the erased sate to a relatively high Vth level, such as to at least the highest target data state (e.g., the C state in this example). In this example, the memory cells are programmed to the Vth distribution 640 using a verify voltage of Vrec_verify>VvC. The Vth distribution 640 is higher than the Vth distribution 630 of the C state, at least in part. In another possible option, Vrec_verify=VvC. In this example, a lower portion of the Vth distribution 640 overlaps with an upper portion of the Vth distribution 630 of the C state. See also FIG. 6F.

After this programming is completed, a period of inactivity is enforced by the controller in which programming or erasing of the memory cells of the block does not occur. There are many blocks, and the other blocks, which are not in a recovery process, continue to be available to program, erase or read data. During this period of inactivity, which can last several minutes or hours, the memory cells undergo a healing or annealing process in which most of the traps are removed. One theory is that traps are removed when hydrogen returns to form passivated SiH bonds. Tests have shown that this healing process is stronger when the memory cells are at a relatively high Vth and when the ambient temperature is relatively high. See also FIG. 7A.

The Vth distribution 640 may represent an initial recovery state for the memory cells in the block immediately after the programming. The Vth distribution 640 transitions to the Vth distribution 641 after a first amount of time in the recovery process. An amount of recovery of the memory cells at this time can be determined based on an amount of downshift of the Vth distribution of the recovery state. The downshift can be measured based on a measurement of the lower tail of the Vth distribution. For example, the lower tail is relatively lower when there are a relatively greater number of memory cells for which Vth<Vrec_verify. A region 641a of the Vth distribution 641 represents this number of memory cells.

Figure 6C:
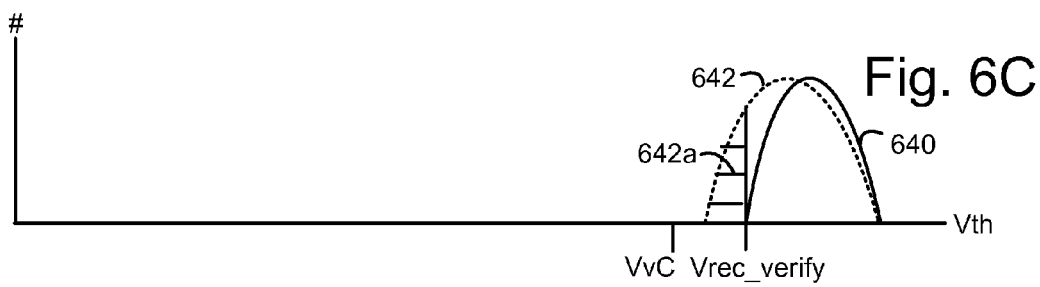
FIG. 6C depicts a count of a number of memory cells having a Vth<Vrec_verify after a second amount of time which is greater than the first amount of time has passed in the recovery progress.

FIG. 6C depicts a count of a number of memory cells having a Vth<Vrec_verify after a second amount of time which is greater than the first amount of time has passed in the recovery progress. As time progresses in the recovery process, the lower tail of the Vth distributions shift further lower, from the Vth distribution 641 to the Vth distribution 642. An additional measurement can be made at this time of the number of memory cells for which Vth<Vrec_amt. A region 642a of the Vth distribution 642 represents this number of memory cells.

Figure 6D:
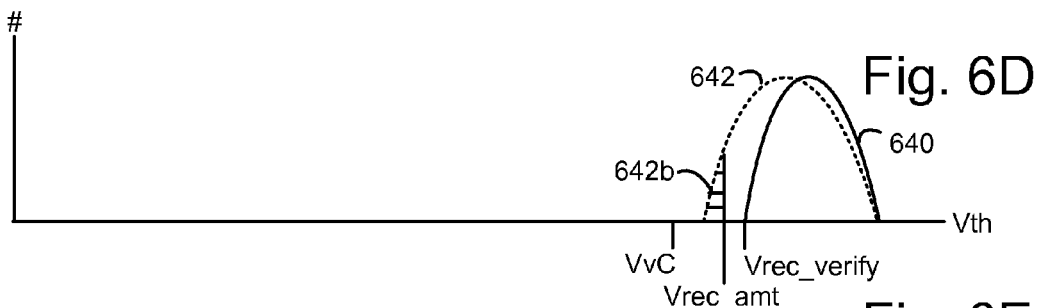
FIG. 6D depicts a Vth distribution of a set of memory cells in a recovery process, showing a count of a number of memory cells having a Vth<Vrec_amt, where Vrec_amt<Vrec_verify and Vrec_verify>VvC.

FIG. 6D depicts a Vth distribution of a set of memory cells in a recovery process, showing a count of a number of memory cells having a Vth<Vrec_amt, where Vrec_amt<Vrec_verify and Vrec_amt>VvC. A region 642b of the Vth distribution 642 represents this number of memory cells. Vrec_amt is a voltage used to determine a recovery amount, and can be the same as, or different than, Vrec_verify. The measurement of the lower tail in this example uses a voltage (Vrec_amt) which is less than the verify voltage (Vrec_verify) used during programming in the recovery process. This allows a more accurate measurement of the lower portion of the lower tail compared to the case where Vrec_amt=Vrec_verify. Another option is to measure the lower tail using multiple voltages such as Vrec_verify in FIG. 6C and Vrec_amt in FIG. 6D.

Figure 6E:
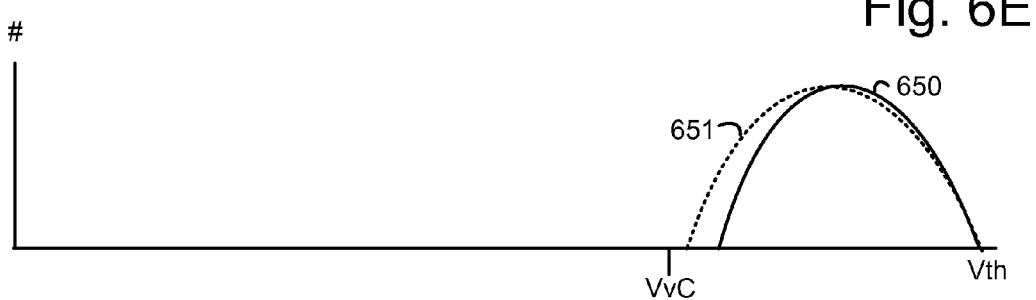
FIG. 6E depicts a Vth distribution of a set of memory cells in a recovery process, where a verify level is not used during programming.

FIG. 6E depicts a Vth distribution of a set of memory cells in a recovery process, where a verify level is not used during programming. By not performing a verify test, the programming in the recovery process can be completed more quickly and power consumption is reduced. The resulting initial Vth distribution 650 will be wider than if a verify test is used, but this can be acceptable. As time progresses in the recovery process, the Vth distribution 650 transitions to the Vth distribution 651. Measurement of the lower tail is also possible in this example.

FIG. 6F depicts the Vth distribution 630 of the highest target data state used in normal programming of user data (from FIG. 6A) with the Vth distribution 640 of the recovery state (from FIG. 6B). A lower portion of the Vth distribution 640 overlaps with an upper portion of the Vth distribution 630 of the C state. A region 645 depicts the overlapping portion.

FIG. 6G depicts the Vth distribution 630 of the highest target data state used in normal programming of user data (from FIG. 6A) with a Vth distribution 640a of the recovery state. The Vth distribution 640a is higher than the Vth distribution 630 and does not overlap with the Vth distribution 630. The Vth distribution 640a is obtained using a verify voltage of Vrec_verify1. In one example, the Vrec_verify1 is set to be a specified amount above the verify level of the highest target data state, e.g., VvC. For example, Vrec_verify1 can be 1-2 V higher than VvC. In another example, Vrec_verify1 exceeds VvC by at least the three-sigma width of the Vth distribution of the C state.

FIG. 7A is a graph depicting a decrease in Vth over time, e.g., a few hours, for a block of memory cells. The graph shows a decrease in Vth for a fresh memory device (plot 700), a cycled memory device which has completed a recovery process with all memory cells in a relatively high recovery state (plot 701), a cycled memory device which has not completed a recovery process and has memory cells in different data states (plot 702) and a cycled memory device which has not completed a recovery process and has all memory cells in the erased state (plot 703). The memory cells were subject to a relatively high temperature. The horizontal axis is logarithmic and the vertical axis is linear. Plot 701 shows that the cycled memory device is repaired by the recovery process to an extent that it performs almost as well as a fresh memory device. Additionally, a higher amount of repair is seen when the memory cells are at a higher Vth level compared to when the memory cells are in the erased state.

FIG. 7B is a plot of drain current (Id) versus control gate voltage (Vcg) as a function of PE cycles. The plot 710 represents a fresh memory device and the plot 711 represents a cycled memory device. When Vcg of a memory cell increases, the memory cells begins to become conductive as indicated by the increase in Id. Generally, it is desirable for the memory cell to have a sharp increase in Id with Vcg. The slope of the plot, which is the subthreshold slope of the memory cell, should therefore also be relatively high.

FIG. 7C is a plot of a subthreshold slope (SS) as a function of PE cycles, showing plots 720 and 720a which apply when no recovery process is used and a plot 720b which applies when a recovery process is used. The squares at 0, PE1, PE2, PE3, PE4 and PE5 represent measured values of SS when no recovery process is used. The circles at PE3, PE4 and PE5 represent measured values of SS when a recovery process is used. The solid lines represent a data fit between the data points. The SS decreases from an initial level, SSinit, as PE cycles accumulate in the memory device, as represent by the plots 720 and 720a. However, the decrease in SS can be halted and the SS can be increased as indicated by the plot 720b. In this example, the recovery time is progressively longer at PE3, PE4 and PE5. This shows that the recovery processes can be spaced closer together in PE cycles as the number of PE cycles increases, toward the end of the lifetime of the memory device. Additionally, the recovery process can be progressively longer as the number of PE cycles increases.

Figure 8A:
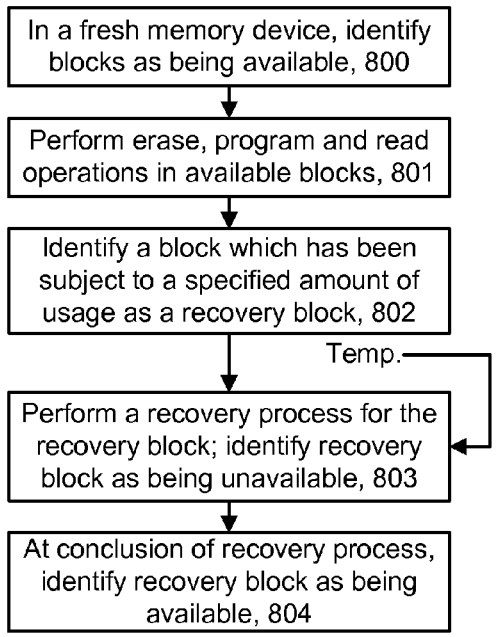
FIG. 8A depicts an example process which involves a recovery process for a block of memory cells.

FIG. 8A depicts an example process which involves a recovery process for a block of memory cells. At step 800, in a fresh memory device, the blocks in a memory device are identified as being available. For example, for each block, the controller may store a data such as a flag which indicates that the block is: a) available for programming of user data and for associated erase operations, or b) not available. Step 801 performs erase, program and read operations in the available blocks. In one approach, a block of user data which is no longer needed can be released to a pool of available blocks 806 (FIG. 8B) in a set of blocks 805, without immediately being erased. When new user data is to be written to the block, the block of unneeded user data is erased before programming in the new user data. Or, if the block is to have a recovery process, the block of unneeded user data is erased before programming the memory cells to the recovery state.

Step 802 comprises identifying a block, e.g., one or more blocks, which has been subject to a specified amount of usage as a recovery block. For example, one approach is to maintain a count of PE cycles for each block. The count could be stored in a reserved portion of the block itself or in the controller, for instance. The block is then determined to be subject to the specified amount of usage when the count of PE cycles reaches one or more target counts, e.g., 3000, 6000, or 9000 cycles.

Another approach is to determine a number of program loops or erase loops most recently used in the block, since these numbers are a function of PE cycles. For example, programming becomes easier as PE cycles increase and as the memory cells become damaged so that a number of program loops becomes smaller as PE cycles increase. The specified amount of usage occurs if the number of program loops falls below a threshold number. Conversely, erasing becomes harder as PE cycles increase and as the memory cells become damaged so that a number of erase loops becomes higher as PE cycles increase. The specified amount of usage occurs if the number of erase loops increase above a threshold number.

Step 803 performs a recovery process for the recovery block and identifies the block as being unavailable. The recovery process could last several minutes or hours. In one approach, the recovery process lasts at least ten minutes. Testing can be used to determine an optimal tradeoff between the amount of recovery and the amount of recovery time. In some cases, the recovery process can last at least 10, 30 or 60 minutes, or at least 1, 3, 6 or 12 hours. The rate at which recovery occurs is faster at a start of the recovery process than at the end.

Moreover, the duration of the recovery period can be relatively shorter when the temperature is relatively higher. The temperature circuit 115 of FIGS. 1B and 1C may be used to determine the temperature. See FIG. 8C for further details of the recovery process. Optionally, the recovery process is not performed if the temperature is below a threshold, since the effectiveness of the recovery is reduced at lower temperatures. In this case, the recovery process can be delayed until the temperature is detected to be above the threshold. For example, the memory device may be in a consumer device such as a camera which the user is carrying outdoors in a cool temperature. When the user moves indoors to a warmer temperature (above the threshold temperature), the recovery process is performed. The threshold temperature may be room temperature, e.g., 21 C or 70 F, or close to room temperature, e.g., 16 C or 61 F, for instance.

Step 804 involves, at the conclusion of the recovery process, identifying the recovery block as being available. That is, the block is returned to a pool of available blocks to store user data. At this point, many of the traps have been removed from the memory cells so that their data retention improves.

Figure 8C:
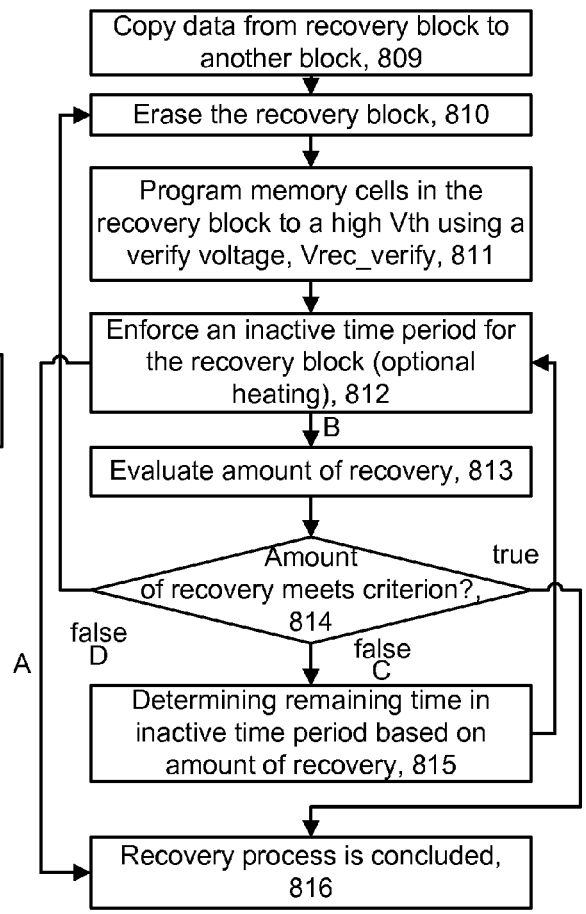
FIG. 8C depicts an example recovery process, consistent with step 803 of FIG. 8A.
Figure 8B:
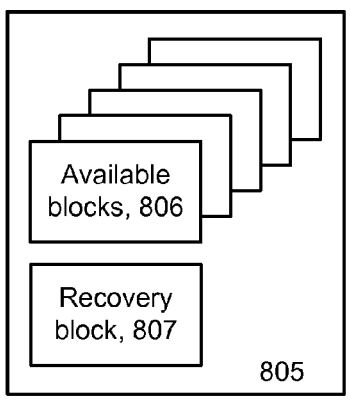
FIG. 8B depicts example available blocks 806 and a recovery block 807 in a set of blocks 805, consistent with FIG. 8A.

FIG. 8B depicts example available blocks 806 and a recovery block 807 in a set of blocks 805, consistent with FIG. 8A. As mentioned, the controller may store data such as a flag which indicates whether each block of the set of blocks is available for programming of user data and for associated erase operations. A block which is not available may be in a recovery process, for example.

FIG. 8C depicts an example recovery process, consistent with step 803 of FIG. 8A. Step 809 involves copying data from the recovery block to another block, if the recovery block has data which should be saved. The recovery block could be in the same chip or another chip. In some cases, the recovery block may have data which is no longer needed, such as when the recovery block has data written to it but is in a pool of available blocks. In this case, the data need not be copied over to another block. Step 810 involves erasing the recovery block, if it is not already in the erased state. Step 811 involves programming memory cells in the recovery block to a high Vth using a verify voltage, Vrec_verify as in FIGS. 6B, 6C, 6D and 6F, or Vrec_verify1 as in FIG. 6G. Step 812 involves enforcing an inactive time period for the recovery block. For example, the controller can set a timer for a specified period of time. The specified period of time can be a function of temperature, as depicted in FIG. 9B, such that the specified period of time is relatively shorter when the temperature is relatively higher. This is based on the fact the recovery process is more effective and occurs more quickly at higher temperatures. The specified period of time can also be a function of PE cycles, as depicted in FIG. 9B, such that the specified period of time is relatively longer when the number of PE cycles is relatively higher. This can be, e.g., the total number of PE cycles of the block and/or a number of PE cycles since a last recovery process for the block. This is based on the fact there is relatively more damage to the memory cells after a relatively higher number of PE cycles have accumulated since the last recovery process, and therefore a relatively longer recovery time is needed to repair the damage. The inactive flag is maintained for the block in this time period in which the block is not available to store user data and no erasing or programming occurs.

Step 812 includes optionally heating the recovery block such as by using a heater as discussed previously.

In one option (option A), the recovery process is concluded at step 816 upon expiration of the timer, at the end of the specified time period without evaluating the amount of recovery. In another option (option B), step 813 is used to evaluate the amount of recovery. For example, this can involve measuring a downshift of the lower tail of the Vth distribution of the recovery state such as discussed in connection with FIG. 6B to 6D. Generally, the memory cells are connected to a plurality of word lines in the block, and the measuring the amount of the downshift comprises applying a voltage to at least one word line of the plurality of word lines while sensing memory cells connected to the at least one word line. In one possible approach, the downshift is measured for memory cells on a specified word line and this downshift represents all cells in the block. In another possible approach, the downshift is measured for memory cells on multiple word lines and an average or median downshift is obtained among the downshift values of the multiple word lines to represent all cells in the block. The multiple word lines can be all word lines in a block or fewer than all word lines in a block.

A decision step 814 determines if the amount of recovery meets a criterion. For example, this can involve determining whether a count of memory cells having a Vth less than Vrec_verify or Vrec_amt is greater than a threshold count. If decision step 814 is true, the criterion is met and the recovery process is concluded at step 816. In this case, the traps have been removed and charges have been released from the tunneling layer, causing a downshift in the Vth.

If decision step 814 is false, in one option (option C), step 815 determines a remaining time in the inactive time period based on the amount of recovery. For example, FIG. 9C shows that the remaining time in the current recovery process can be relatively smaller when the amount of recovery (e.g., the count of memory cells having a Vth less than the checkpoint voltage of Vrec_verify or Vrec_amt) is relatively higher. Thus, the remaining time is set adaptively based on the amount of recovery. This allows the remaining time, and the total time spent in the recovery process to be optimized for a block to achieve a desired amount of recovery. The total recovery time can thus be made shorter for a block which recovers faster. As an example, the inactive time period at step 812 may be 60 minutes. The remaining time at step 815 may be 30 minutes if 10% of the memory cells have a Vth below the checkpoint voltage and 15 minutes if 20% of the memory cells have a Vth below the checkpoint voltage. The remaining time is longer when the amount of recovery is lower.

If decision step 814 is false, in another option (option D), step 810 is repeated by erasing the block, followed by steps 811 and 812. In this case, an additional recovery process is performed which includes the sequence of erasing followed by programming to the high Vth level and enforcing an inactive period. It is also possible to set the time period of the additional recovery process adaptively such that the time period is relatively smaller when the amount of recovery in the initial recovery process is relatively higher, as depicted in FIG. 9C.

Figure 8D:
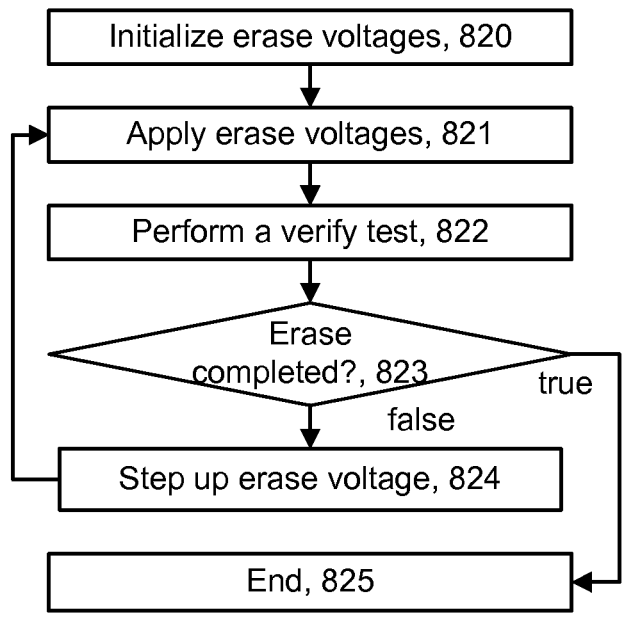
FIG. 8D depicts an example erase operation, consistent with step 810 of FIG. 8C.

FIG. 8D depicts an example erase operation, consistent with step 810 of FIG. 8C. Step 820 initializes erase voltages. For example, this can include voltages for the control gates of memory cells and select gate transistors, bit lines, source lines and channels. For an incremental step pulse erase operation, an initial erase voltage which is applied to the word line, drain or source can be initialized. Step 821 includes applying the erase voltages, e.g., to provide a negative gate-to-channel voltage. Step 822 includes performing a verify test for the set of memory cells, e.g., using a verify voltage of Vv_erase. Decision step 823 determines if the erase operation is completed, e.g., based on results of the verify test. If decision step 823 is true, the end of the erase operation is reached at step 825. If decision step 823 is false, an erase voltage can be stepped up at step 824 and the memory cells are again biased using the erase voltages at step 821, in a next iteration of the erase operation. See also FIGS. 10C and 11.

Figure 8E:
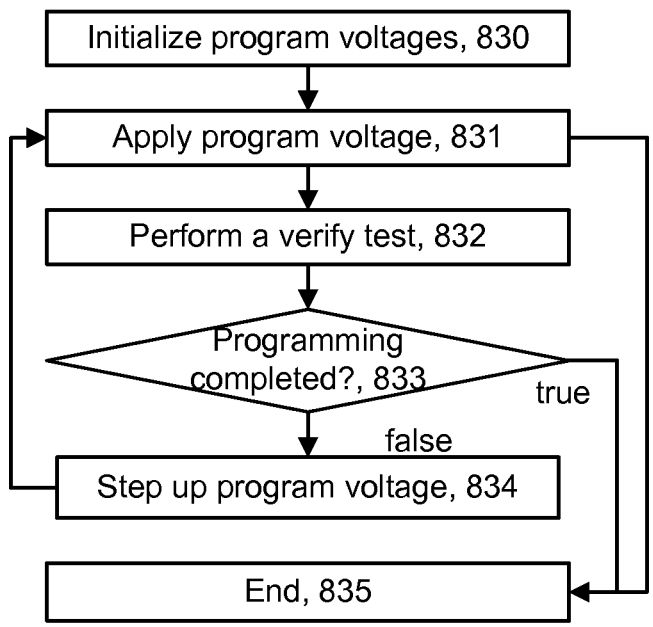
FIG. 8E depicts an example programming operation, consistent with step 811 of FIG. 8C.

FIG. 8E depicts an example programming operation, consistent with step 811 of FIG. 8C. In one approach, the memory cells are programmed one word line at a time in a word line programming order, starting from a source-side word line of the block and proceeding one word line at a time to a drain-side word line of the block. In another approach, the memory cells of all word lines in the block are programmed concurrently. In this case, if a verify test is performed, it may be performed for one word line at a time, as an example.

Step 830 initializes program voltages for a currently selected word line, for instance. For example, this can include voltages for the control gates of memory cells and select gate transistors, bit lines, source lines and channels. For an incremental step pulse programming operation, an initial program voltage which is applied to the word line, drain or source can be initialized. Step 831 includes applying the program voltages, e.g., to provide a positive gate-to-channel voltage. Step 832 includes performing a verify test for the memory cells connected to the word line. For example, this can involve applying a verify voltage Vrec_verify or Vrec_amt. Decision step 833 determines if programming of the memory cells is completed. This is true when all, or almost all, of the memory cells have passed their respective verify test. If decision step 833 is false, a program voltage such as Vpgm is stepped up at step 834 and step 831 is repeated in a next program-verify iteration or loop. If decision step 833 is true, the programming ends at step 835.

Figure 9A:
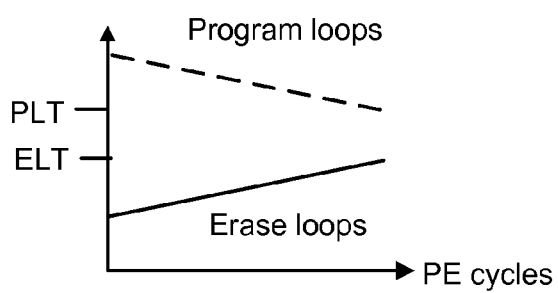
FIG. 9A depicts a plot of program loops or erase loops as a function of PE cycles.
Figure 9B:
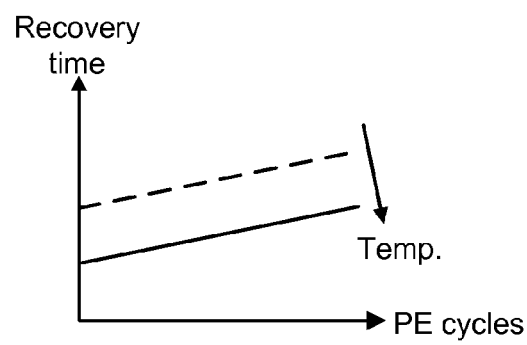
FIG. 9B depicts a plot of a recovery time of a recovery process as a function of PE cycles and temperature.
Figure 9C:
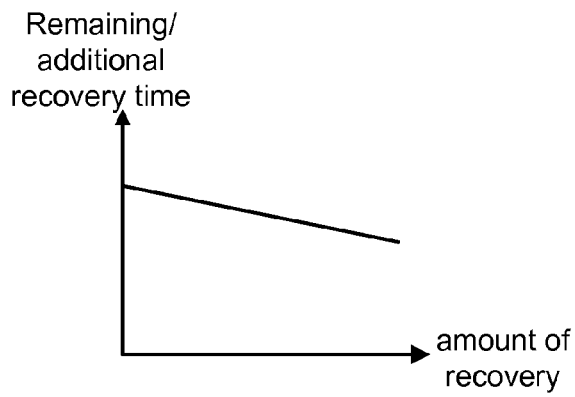
FIG. 9C depicts a plot of a remaining time in a current recovery process or an additional time period in another recovery process as a function of an amount of recovery.

FIG. 9A depicts a plot of program loops (dashed line) or erase loops (solid line) as a function of PE cycles. As mentioned in connection with step 802 of FIG. 8A, as PE cycles increase, programming becomes easier and erasing becomes harder. Thus, a specified amount of usage of the block may be indicated if the number of program loops falls below a threshold number of PLT, or if the number of erase loops exceeds a threshold number of ELT. Typically, the memory cells in all word lines of a block are erased concurrently, so that an erase loop number can be associated with an erase of the block. This number could be stored in a reserved portion of the block itself or in the controller, for instance. For example, this number could be the erase loop count from the most recent erase operation. Or, this number could be an average or median erase loop count for a specified number of most recent erase operations.

A programming operation typically involves programming memory cells of one word line at a time, so that different program loops numbers may be associated with different word lines, especially in the case of a 3D memory in which the width of the memory hole varies, as discussed in connection with FIG. 3C2. A program loop number which is used to determine usage of the block can be from a specified word line, or obtained as an average or median of the program loop numbers of different word lines. This number could be stored in a reserved portion of the block itself or in the controller, for instance. For example, this number could be the program loop count from the most recent programming operation. Or, this number could be an average or median program loop count for a specified number of most recent programming operations.

FIG. 9B depicts a plot of a recovery time of a recovery process as a function of PE cycles and temperature. The dashed line corresponds to a relatively lower temperature and the solid line corresponds to a relatively higher temperature. The recovery time is relatively shorter when the temperature is relatively higher, and relatively longer when the number of PE cycles is relatively higher.

In some cases, the memory device is operated in an environment which has a relatively high temperature. For example, the memory device may be in a server in a data center which has a regulated temperature. A recent trend is to operate data centers at increasingly higher temperatures to reduce the amount of energy used to cool the data center. An increase in the server failure rate is considered to be an acceptable trade-off. Conventionally, a temperature range of 20-22 C/68-72 F was considered to be ideal. Recently, the ASHRAE (American Society of Heating, Refrigerating and Air-Conditioning Engineers) defined four environmental classes that are appropriate for data centers, where a temperature of up to 45 C/113 F is allowed. This trend of operating memory devices at higher temperatures increases the effectiveness of the recovery process.

FIG. 9C depicts a plot of a remaining time in a current recovery process or an additional time period in another recovery process as a function of an amount of recovery. The remaining/additional time can be relatively shorter when the amount of recovery is relatively higher.

Figure 9D:
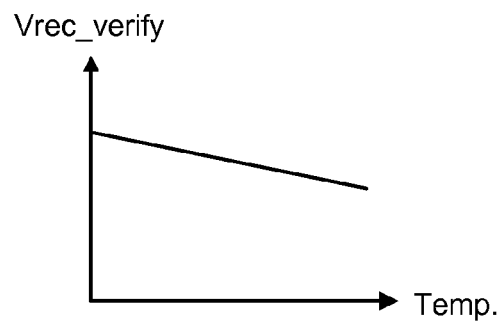
FIG. 9D depicts a plot of a verify voltage in a recovery process as a function of temperature.

FIG. 9D depicts a plot of a verify voltage in a recovery process as a function of temperature. The verify voltage of the recovery process can be relatively lower when the temperature is relatively higher. This is true because the recovery process is more effective when the Vth level and/or the temperature is relatively higher. In other words, to achieve a specified amount of recovery in a specified recovery time, a relatively lower verify voltage can be used when the temperature is relatively higher, or a relatively higher verify voltage can be used when the temperature is relatively lower.

Figure 9E:
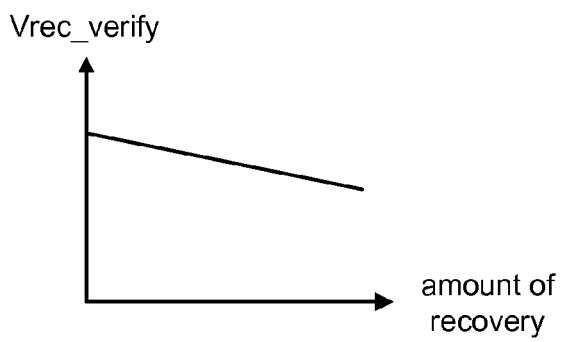
FIG. 9E depicts a plot of a verify level in another recovery process as a function of an amount of recovery in an initial recovery process.

FIG. 9E depicts a plot of a verify level in another recovery process as a function of an amount of recovery in an initial recovery process. The verify level can be relatively lower when the amount of recovery is relatively higher, to achieve a given amount of recovery in the another recovery process. For example, the initial recovery process may be a first recovery process and the another recovery process may be a second recovery process which immediately follows the first recovery process, for a block which has a given number of PE cycles.

Figure 10A:
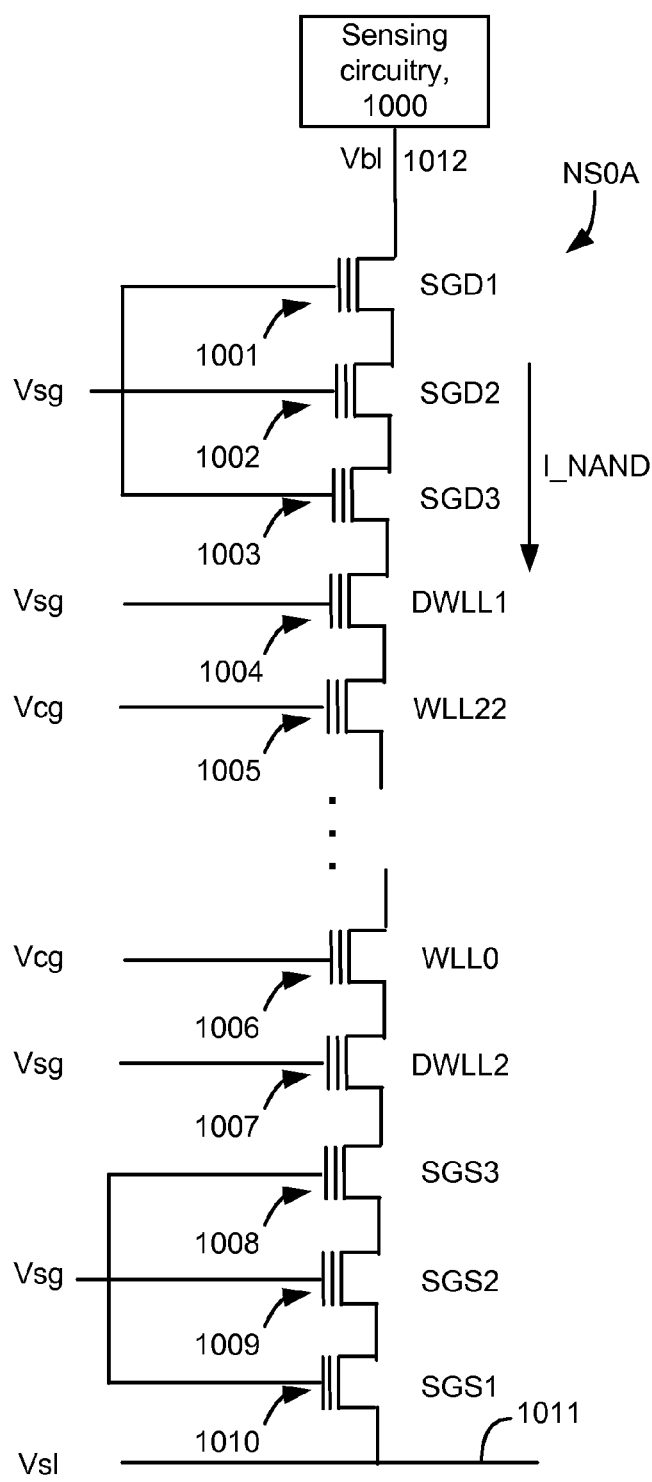
FIG. 10A depicts a circuit diagram of a NAND string consistent with the memory devices of FIGS. 2C and 3C1.

FIG. 10A depicts a circuit diagram of a NAND string consistent with the memory devices of FIGS. 2C and 3C1. An example NAND string NS0A, consistent with FIG. 3C1 (or NS0 consistent with FIG. 2C), includes SGD transistors 1001, 1002 and 1003, a drain-side dummy memory cell 1004, data-storing memory cells 1005, . . . , 1006, a source-side dummy memory cell 1007, and SGS transistors 1008, 1009 and 1010. A bit line 1012 connects the drain end of the NAND string to sensing circuitry 1000, which is used to sense the NAND string during operations involving the select gate transistors and the memory cells. A source line 1011 is connected to a source end of the NAND string. Voltage drivers can be used to provide the voltages depicted. For example, Vsg is applied to the control gates of the SGD transistors, which are optionally connected to one another and to the control gates of the SGS transistors, which are optionally connected to one another. Vsg can also be applied to the dummy memory cells 1004 and 1007. During an erase operation, a common control gate voltage Vcg can be applied to each of the data-storing memory cells concurrently, in this example. During a programming operation, a program voltage Vpgm is applied to the selected word line and pass voltages are applied to the other word lines. Vbl is the bit line voltage and Vsl is the source line voltage. I_NAND is a sensed current in the NAND string. The current can be sensed during a verify test of an erase operation or a programming operation, as well as during a read operation in which the data states of the memory cells are determined.

Figure 10B:
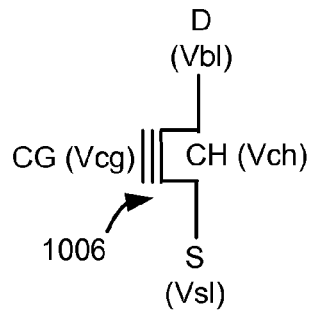
FIG. 10B depicts a circuit diagram of the memory cell 1006 of FIG. 10A.

FIG. 10B depicts a circuit diagram of the memory cell 1006 of FIG. 10A. The memory cell includes a number of terminals including a drain (D) terminal which may have a voltage Vbl, a source (S) terminal which may have a voltage Vsl, a control gate (CG) terminal which may have a voltage Vcg and a channel (CH) terminal which may have a voltage Vch.

Figure 10C:
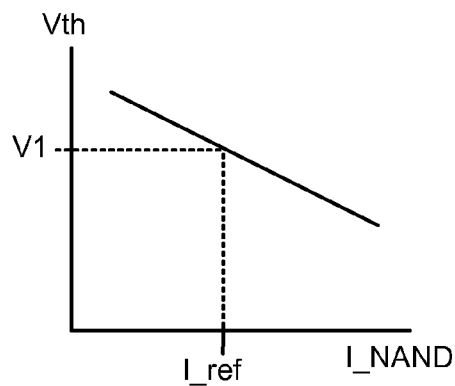
FIG. 10C depicts a plot of Vth versus I_NAND, a current in a NAND string during a verify test of an erase operation, consistent with step 822 of FIG. 8D.

FIG. 10C depicts a plot of Vth versus I_NAND, a current in a NAND string during a verify test of an erase operation, consistent with step 822 of FIG. 8D. An erase operation can include a number of erase-verify iterations or loops which are performed until the erase operation is completed. An erase-verify iteration includes an erase portion in which an erase voltage is applied, followed by a verify test. While it possible to verify memory cells in one or more selected word lines, typically an entire block is erased, in which case the verification can be performed concurrently for all memory cells in one or more NAND strings. During a verify operation for the memory cells of a NAND string, a verify voltage (Vv_erase) is applied to the control gates of the memory cells while a bit line voltage is supplied using sensing circuitry. The select gate transistors and dummy memory cells are provided in a conductive state and act as pass gates. A current in the NAND string is detected and compared to a reference current, e.g., using a current comparison circuit. If the current in the NAND string exceeds the reference current, this indicates the memory cells in the NAND string are in a conductive state, so that their Vth is below Vv_erase. That is, all of the memory cells in the NAND string are erased and the NAND string passes the verify test. On the other hand, if the current in the NAND string does not exceed the reference current, this indicates the memory cells in the NAND string are in a non-conductive state, so that their Vth is above Vv_erase. That is, not all of the memory cells in the NAND string are erased and the NAND string does not pass the verify test.

For a set of NAND strings, the erase operation can be considered to be completed when all, or at least a specified majority, of the NAND strings pass the verify test. If the erase operation is not completed after an erase-verify iteration, another erase-verify iteration can be performed using a stronger erase voltage.

Figure 11:
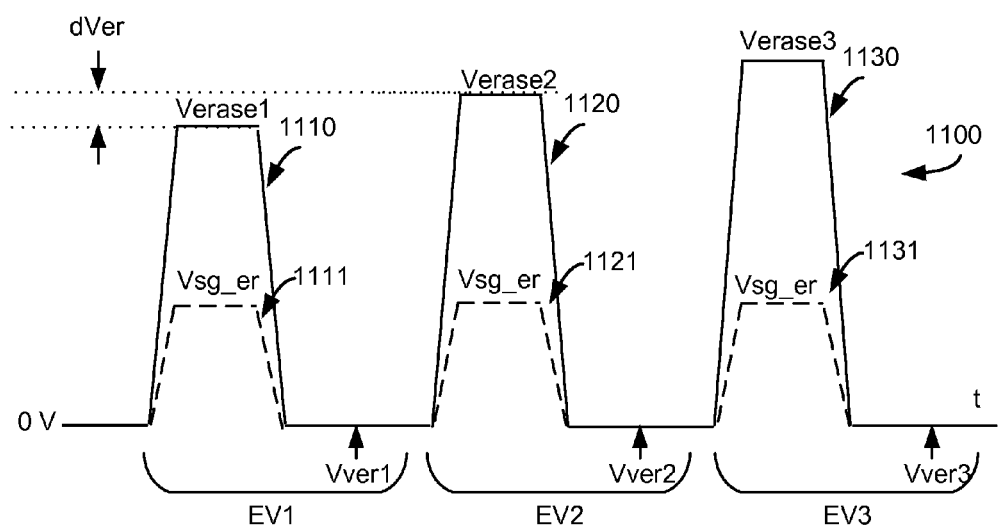
FIG. 11 depicts a waveform in an example erase operation, consistent with step 821 of FIG. 8D.

FIG. 11 depicts a waveform in an example erase operation, consistent with step 821 of FIG. 8D. The vertical axis depicts voltage and the horizontal axis depicts time. The waveform 1100 depicts a series of bit line and/or source line voltages 1110, 1120 and 1130 with magnitudes of Verase1, Verase2 and Verase3, respectively, which step up by dVer in each erase-verify iteration. The waveform also depicts select gate voltages 1111, 1121 and 1131 with a common magnitude of Vsg_er, in one approach. In another approach, the select gate voltage also steps up with the bit line and/or source line voltage. The waveform provides a number of erase-verify iterations EV1, EV2 and EV3, each of which is followed by a verify test Vver1, Vver2 or Vver3, respectively. The channel of a NAND string can be charged up in an erase operation based on gate-induced drain leakage (GIDL), which is generated in proportion to the drain-to-gate voltage of one or both select gate transistors. In another option, the erase voltage steps up to its peak in two steps instead of one to allow time for the charge up of the channel to occur. In another option, the erase voltage and the select gate voltage both step up to their peaks in two steps.

Figure 12A:
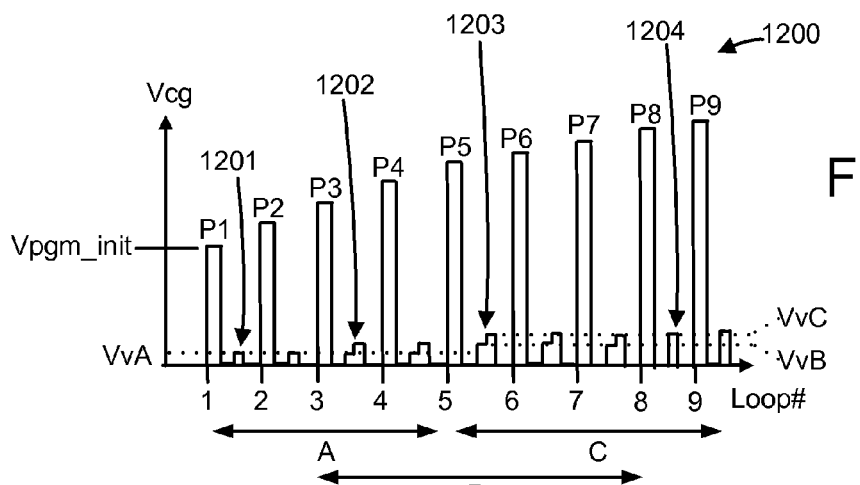
FIG. 12A depicts voltages applied to a word line in an example normal (non-recovery) programming operation, consistent with step 801 of FIG. 8A.

FIG. 12A depicts voltages applied to a word line in an example normal (non-recovery) programming operation, consistent with step 801 of FIG. 8A. The horizontal axis depicts time or program loops and the vertical axis depicts Vcg, the voltage on an nth word line which is selected for programming. The programming operation comprises a series of waveforms 1200. Incremental step pulse programming is performed for each target data state. This example also performs verify tests based on the program loop. For example, the A, B and C state cells are verified in loops 1-4, 3-7 and 5-9, respectively. An example verify waveform 1201 comprises an A state verify voltage at VvA. An example verify waveform 1202 comprises A and B state verify voltages at VvA and VvB, respectively. An example verify waveform 1203 comprises B and C state verify voltages at VvB and VvC, respectively. An example verify waveform 1204 comprises a C state verify voltage at VvC. The program pulses P1, P2, P3, P4, P5, P6, P7, P8 and P9 are also depicted.

Figure 12B:
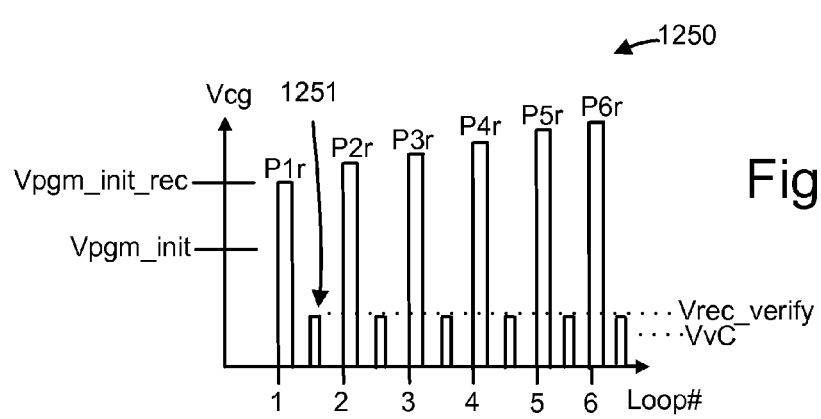
FIG. 12B depicts voltages applied to a word line in an example programming operation in a recovery process, consistent with step 811 of FIG. 8C.

FIG. 12B depicts voltages applied to a word line in an example programming operation in a recovery process, consistent with step 811 of FIG. 8C. The horizontal axis depicts time or program loops and the vertical axis depicts Vcg, the voltage on an nth word line which is selected for programming. Since all memory cells are programmed to a high Vth which is at least as high as the highest data state, a higher initial Vpgm can be used than in the normal programming. In this case, Vpgm_init_rec>Vpgm_init. Also, verify voltages, such as example verify waveform 1251, at a level of Vrec_verify>=(verify voltage of highest target data state such as VvC) can be applied for the recovery state. The total number of loops for programming in the recovery process may be less than for normal programming. Furthermore, a step size for Vpgm can be greater in the programming in the recovery process than for normal programming since a higher upper tail in the Vth distribution is permissible. This is because the measurement of the amount of recovery involves the lower tail rather than the upper tail.

The programming operation comprises a series of waveforms 1250. Incremental step pulse programming is performed. The memory cells are verified in loops 1-6. The program pulses P1r, P2r, P3r, P4r, P5r and P6r are also depicted.

Figure 12C:
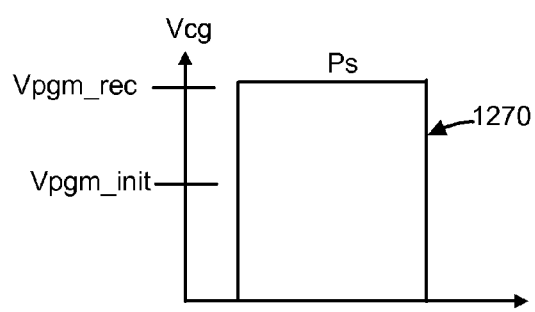
FIG. 12C depicts a single program voltage 1270 which is applied to a word line in an example programming operation in a recovery process, consistent with step 811 of FIG. 8C and with the Vth distribution 650 of FIG. 6E.

FIG. 12C depicts a single program voltage 1270 which is applied to a word line in an example programming operation in a recovery process, consistent with step 811 of FIG. 8C and with the Vth distribution 650 of FIG. 6E. In this alternative, a single program pulse is used without a verify test. This approach can save time and is suitable for option A in FIG. 8C where there is no evaluation of the amount of recovery. In this case, since the lower tail is not measured to determine the amount of recovery, the lower tail does not have to be precisely located relative to a verify voltage.

Accordingly, it can be seen that, in one embodiment, a method for operating a memory device comprises: determining that memory cells in a block have been subject to a specified amount of usage, the memory cells in the block store data in different data states including an erased state and a highest data state, the erased state is represented by a respective threshold voltage distribution and the highest data state is represented by a respective threshold voltage distribution which is higher than the respective threshold voltage distribution of the erased state; and in response to the determining, performing a data recovery process for the memory cells, the performing the data recovery process comprises erasing the block, programming the memory cells, wherein the memory cells are programmed to a threshold voltage distribution which is at least as high as the respective threshold voltage distribution of the highest data state, and enforcing a time period of at least ten minutes in which detrapping occurs for the memory cells while programming of the block is not allowed and erasing of the block is not allowed.

In another embodiment, a memory device comprises: memory cells in a block, the memory cells in the block store data in different data states including an erased state and a highest data state; and a control circuit. The control circuit is configured to: make a determination that the memory cells have been subject to a specified amount of usage, and in response to the determination, perform a data recovery process for the memory cells. The control circuit, to perform the data recovery process, is configured to: erase the block, program the memory cells to at least the highest data state, enforce one time period of inactivity for the memory cells, at a conclusion of the one time period, perform an evaluation of an amount of recovery of the memory cells, if the amount of recovery meets a criterion, release the block to a pool of blocks which are available to be programmed, and if the amount of recovery does not meet the criterion, perform another data recovery process for the memory cells, wherein the control, to perform the another data recovery process, is configured to: erase the block, program the memory cells to the at least to the highest data state, and enforce another time period of inactivity for the memory cells.

In another embodiment, a memory controller comprises: a storage device comprising a set of instructions, and a processor operable to execute the set of instructions. The set of instructions comprises: instructions to determine that memory cells in a block have been subject to a specified amount of usage, the memory cells in the block store data in different data states including an erased state and a highest data state, the erased state is represented by a respective threshold voltage distribution and the highest data state is represented by a respective threshold voltage distribution which is higher than the respective threshold voltage distribution of the erased state; instructions to perform a data recovery process for the memory cells by erasing the block, programming the memory cells to a threshold voltage distribution which is at least as high as the respective threshold voltage distribution of the highest data state, and enforcing a time period of at least ten minutes in which the memory cells are inactive; and instructions to release the block to a pool of blocks which are available to be programmed upon conclusion of the time period; and In another embodiment, a memory device comprises: memory cells in a block, the memory cells in the block store data in different data states including an erased state and a highest data state; and a control circuit. The control circuit is configured to: make a determination that the memory cells have been subject to a specified amount of usage, and in response to the determination, and perform a data recovery process for the memory cells, the control, to perform the data recovery process, is configured to erase the block, program the memory cells to at least the highest data state, and enforce a time period of at least ten minutes in which detrapping occurs for the memory cells while programming of the block is not allowed and erasing of the block is not allowed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:
  determining that memory cells in a block have been subject to a specified amount of usage, the memory cells in the block store data in different data states including an erased state and a highest data state, the erased state is represented by a respective threshold voltage distribution and the highest data state is represented by a respective threshold voltage distribution which is higher than the respective threshold voltage distribution of the erased state; and
  in response to the determining, performing a data recovery process for the memory cells, the performing the data recovery process comprises erasing the block, programming the memory cells, wherein the memory cells are programmed to a threshold voltage distribution which is at least as high as the respective threshold voltage distribution of the highest data state, and enforcing a time period of at least ten minutes in which detrapping occurs for the memory cells while programming of the block is not allowed and erasing of the block is not allowed.

2. The method of claim 1, further comprising:
at a conclusion of the time period, evaluating an amount of recovery of the memory cells; and
if the amount of recovery meets a criterion, releasing the block to a pool of blocks which are available to be programmed.

3. The method of claim 2, wherein:
the programming the memory cells comprises performing a plurality of program loops in which threshold voltages of the memory cells are verified to exceed a verify voltage;
the evaluating the amount of recovery of the memory cells comprises measuring an amount of a downshift of a threshold voltage below the verify voltage for one or more of the memory cells; and
the amount of recovery meets the criterion if the amount of the downshift exceeds a specified amount.

4. The method of claim 3, wherein:
the memory cells are connected to a plurality of word lines in the block; and
the measuring the amount of the downshift comprises applying a voltage to at least one word line of the plurality of word lines while sensing memory cells connected to the at least one word line.

5. The method of claim 3, wherein:
the measuring the amount of the downshift comprises counting a number of the memory cells having a threshold voltage below the verify voltage.

6. The method of claim 1, wherein:
the memory cells are programmed to a threshold voltage distribution which is higher, at least in part, than the respective threshold voltage distribution of the highest data state.

7. The method of claim 1, further comprising:
determining a temperature in the memory device; and
adjusting the time period based on the temperature so that the time period is relatively shorter when the temperature is relatively higher.

8. The method of claim 1, further comprising:
determining a temperature in the memory device; and
if the temperature is below a specified level, delaying the performing of the data recovery process until the temperature is above the specified level.

9. The method of claim 1, further comprising:
determining a temperature in the memory device, wherein the programming the memory cells comprises performing a plurality of program loops in which threshold voltages of the memory cells are verified to exceed a verify voltage, and the verify voltage is relatively high when the temperature is relatively low.

10. The method of claim 1, wherein:
the determining that the memory cells have been subject to the specified amount of usage comprises determining that the memory cells have been subject to a specified number of program-erase cycles, and the time period is a function of the specified number of program-erase cycles.

11. The method of claim 10, wherein:
the time period is a function of a number of program-erase cycles since a most recent data recovery process for the memory cells.

12. The method of claim 1, further comprising:
at a conclusion of the time period, releasing the block to a pool of blocks which are available to be programmed.

13. The method of claim 1, further comprising:
at a conclusion of the time period, evaluating an amount of recovery of the memory cells; and
if the amount of recovery does not meet a criterion, performing another data recovery process for the memory cells, the performing the another data recovery process comprises erasing the block, programming the memory cells to a threshold voltage distribution which is at least as high as the respective threshold voltage distribution of the highest data state, and enforcing another time period of at least ten minutes in which detrapping occurs for the memory cells while programming of the block is not allowed and erasing of the block is not allowed.

14. The method of claim 13, wherein:
a duration of the another time period is relatively longer when the amount of recovery is relatively lower.

15. The method of claim 13, wherein:
a verify voltage used in the programming of the memory cells in the another data recovery process is relatively lower when the amount of recovery is relatively higher.

16. The method of claim 1, further comprising:
during the time period, evaluating an amount of recovery of the memory cells and determining a remaining time in the time period based on the amount of recovery, where the remaining time is relatively short when the amount of recovery is relatively high.

17. A memory device, comprising:
memory cells in a block, the memory cells in the block store data in different data states including an erased state and a highest data state; and
a control circuit, the control circuit is configured to:
make a determination that the memory cells have been subject to a specified amount of usage, and
in response to the determination, perform a data recovery process for the memory cells, wherein the control circuit, to perform the data recovery process, is configured to:
erase the block,
program the memory cells to at least the highest data state,
enforce one time period of inactivity for the memory cells,
at a conclusion of the one time period, perform an evaluation of an amount of recovery of the memory cells,
if the amount of recovery meets a criterion, release the block to a pool of blocks which are available to be programmed, and
if the amount of recovery does not meet the criterion, perform another data recovery process for the memory cells, wherein the control circuit, to perform the another data recovery process, is configured to: erase the block, program the memory cells to the at least to the highest data state, and enforce another time period of inactivity for the memory cells.

18. The memory device of claim 17, wherein:
the control circuit, to program the memory cells to the at least to the highest data state comprises, is configured to perform a plurality of program loops in which threshold voltages of the memory cells are verified to exceed a verify voltage;
the evaluation is based on a measurement of an amount of a downshift of a threshold voltage below the verify voltage for one or more of the memory cells; and
the amount of recovery meets the criterion if the amount of the downshift exceeds a specified amount.

19. The memory device of claim 17, wherein the control circuit is configured to:
   determine a temperature in the memory device; and
   adjust the one time period based on the temperature so that the one time period is relatively shorter when the temperature is relatively higher.

20. The memory device of claim 17, wherein the control circuit is configured to:
   determine a temperature in the memory device, and, to program the memory cells to the at least to the highest data state, perform a plurality of program loops in which threshold voltages of the memory cells are verified to exceed a verify voltage, and the verify voltage is relatively high when the temperature is relatively low.

21. A memory controller, comprising:
   a storage device comprising a set of instructions, the set of instructions comprising:
      instructions to determine that memory cells in a block have been subject to a specified amount of usage, the memory cells in the block store data in different data states including an erased state and a highest data state, the erased state is represented by a respective threshold voltage distribution and the highest data state is represented by a respective threshold voltage distribution which is higher than the respective threshold voltage distribution of the erased state;
      instructions to perform a data recovery process for the memory cells by erasing the block, programming the memory cells to a threshold voltage distribution which is at least as high as the respective threshold voltage distribution of the highest data state, and enforcing a time period of at least ten minutes in which the memory cells are inactive; and
      instructions to release the block to a pool of blocks which are available to be programmed upon conclusion of the time period; and
   a processor operable to execute the set of instructions.

22. The memory controller of claim 21, further comprising:
   instructions to adjust the time period based on a temperature of the memory cells so that the time period is relatively shorter when the temperature is relatively higher.

23. The memory controller of claim 21, wherein:
   the instructions to perform the data recovery process comprise instructions to program the memory cells while performing a plurality of program loops in which threshold voltages of the memory cells are verified to exceed a verify voltage, wherein the verify voltage is relatively high when a temperature of the memory cells is relatively low.

24. The memory controller of claim 21, wherein:
   the instructions to determine that memory cells have been subject to the specified amount of usage comprise instructions to determine that the memory cells have been subject to a specified number of program-erase cycles, wherein the time period is a function of the specified number of program-erase cycles.

\* \* \* \* \*